US008012605B2

(12) United States Patent
Kim et al.

(10) Patent No.: US 8,012,605 B2
(45) Date of Patent: *Sep. 6, 2011

(54) ORGANIC LIGHT-EMITTING COMPOUND AND ORGANIC ELECTROLUMINESCENT DEVICE USING THE SAME

(75) Inventors: Myeong-Suk Kim, Yongin-si (KR); Dong-Woo Shin, Yongin-si (KR); Woon-Jung Paek, Yongin-si (KR); Byoung-Ki Choi, Yongin-si (KR); O-Hyun Kwon, Yongin-si (KR); Eun-Sil Han, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 635 days.

This patent is subject to a terminal disclaimer.

(21) Appl. No.: 11/802,399

(22) Filed: May 22, 2007

(65) Prior Publication Data
US 2007/0270595 A1 Nov. 22, 2007

(30) Foreign Application Priority Data
May 22, 2006 (KR) .................. 10-2006-0045811

(51) Int. Cl.
*H01L 51/54* (2006.01)
*C09K 11/06* (2006.01)

(52) U.S. Cl. ........ 428/690; 428/917; 313/504; 313/506; 549/49; 549/462; 257/E51.05

(58) Field of Classification Search .................. None
See application file for complete search history.

(56) References Cited

U.S. PATENT DOCUMENTS

| 3,172,862 | A | 3/1965 | Gurnee et al. ............ 252/301.16 |
| 4,356,429 | A | 10/1982 | Tang |
| 6,410,562 | B1 | 6/2002 | Jirousek et al. |
| 6,713,193 | B2 | 3/2004 | Lin ............................... 428/690 |
| 6,929,870 | B2 | 8/2005 | Ishida et al. ................... 428/690 |
| 2003/0118866 | A1 | 6/2003 | Oh et al. ........................ 428/690 |
| 2004/0061435 | A1 | 4/2004 | Liao et al. ...................... 313/504 |
| 2004/0081853 | A1 | 4/2004 | Conley et al. ................. 428/690 |
| 2004/0146746 | A1* | 7/2004 | Lee et al. ...................... 428/690 |
| 2007/0224448 | A1 | 9/2007 | Ikeda et al. ................... 428/690 |

FOREIGN PATENT DOCUMENTS

| JP | 11-003782 | 1/1999 |
| JP | 2000091075 | 3/2000 |
| JP | 2000091075 A * | 3/2000 |
| JP | 2003-146951 | 5/2003 |
| JP | 2004-091334 | 3/2004 |
| JP | 2005047868 | 2/2005 |
| JP | 2005047868 A * | 2/2005 |

OTHER PUBLICATIONS

Machine translation of JP2000-091075. Date of publication: Mar. 31, 2000.*
Machine translation of JP2003-146951. Date of publication: May 21, 2003.*
Machine translation of JP2005-047868. Date of publication: Feb. 24, 2005.*
Yoshiyuki Kuwabara et al., "Thermally Stable Multilayered Organic Electrolunimescent Devices Using Novel Starburst Molecules, 4,4',4"-Tri(N-carbazolyl)triphenylamine (TCTA) and 4,4',4"-Tris(3-methylphenylphenyl-amino)triphenylamine(m-MTDATA),as Hole-Transport Materials", Adv. Mater. 1994, 6, No. 9, pp. 677-679.
Lehmann, R. B.; Daub, G. H.; Hayes, F. N.; Yguerabide, J. Org. Scintill. Liquid Scintill. Counting, Proc. Int. Conf. (1971), Meeting Date 1970, 441-57.
Office Action (Paper No. 20091231) issued by U.S. PTO on Jan. 8, 2010 in U.S. Appl. No. 11/525,100.
Office Action (Paper No. 20090521) issued by U.S. PTO on Jun. 11, 2009 in U.S. Appl. No. 11/525,100.
Chinese Office Action issued by the Chinese Patent Office, dated Dec. 3, 2010, corresponding to Chinese Patent Application No. 200710008058.0, together with a Request for Entry.
Chinese Office Action issued by the Chinese Patent Office dispatched Jun. 10, 2010, Application No. 200610063977.3 and File No. 2010060700403550 together with English translation.

* cited by examiner

*Primary Examiner* — Dawn L. Garrett
*Assistant Examiner* — Andrew K Bohaty
(74) *Attorney, Agent, or Firm* — Robert E. Bushnell, Esp.

(57) ABSTRACT

Provided are an organic light-emitting compound represented by Formula 1 and an organic electroluminescent (EL) device using the same:

(1)

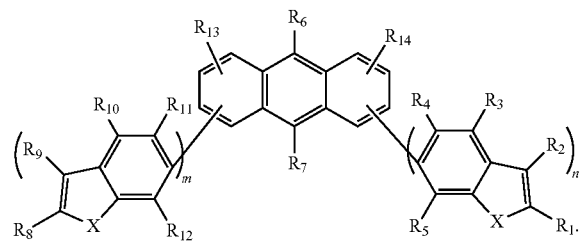

The organic light-emitting compound has thermostability and photochemical stability in addition to superior electrical features. The organic EL device using the organic light-emitting compound has low driving voltage, high efficiency, and superior color purity.

17 Claims, 2 Drawing Sheets

FIG. 1A

| SECOND ELECTRODE |
|---|
| ELECTRON INJECTION LAYER |
| ELECTRON TRANSPORT LAYER |
| LIGHT-EMITTING LAYER |
| HOLE INJECTION LAYER |
| FIRST ELECTRODE |

FIG. 1B

| SECOND ELECTRODE |
|---|
| ELECTRON INJECTION LAYER |
| ELECTRON TRANSPORT LAYER |
| LIGHT-EMITTING LAYER |
| HOLE TRANSPORT LAYER |
| HOLE INJECTION LAYER |
| FIRST ELECTRODE |

FIG. 1C

| SECOND ELECTRODE |
|---|
| ELECTRON INJECTION LAYER |
| ELECTRON TRANSPORT LAYER |
| HOLE BLOCKING LAYER |
| LIGHT-EMITTING LAYER |
| HOLE TRANSPORT LAYER |
| HOLE INJECTION LAYER |
| FIRST ELECTRODE |

ORGANIC LIGHT-EMITTING COMPOUND AND ORGANIC ELECTROLUMINESCENT DEVICE USING THE SAME

CROSS-REFERENCE TO RELATED PATENT APPLICATION AND CLAIM OF PRIORITY

This application claims the benefit of Korean Patent Application No. 10-2006-0045811, filed on May 22, 2006, in the Korean Intellectual Property Office, the disclosure of which is incorporated herein in its entirety by reference.

BACKGROUND OF THE INVENTION

1. Field of the Invention

The present invention relates to an organic light-emitting compound and an organic electroluminescent (EL) device using the same, and more particularly, to an organic light-emitting compound which has superior electric features, thermostability, and photochemical stability, and can accomplish low driving voltage, high efficiency, and superior color purity of organic electroluminescent devices, and to an organic EL device using the same.

2. Description of the Related Art

An electroluminescent (EL) device is a self-emitting device which has a wide viewing angle, excellent contrast, and quick response time. EL devices can be classified into inorganic EL devices which use inorganic compounds for emissive layers and organic EL devices which use organic compounds for emissive layers. Compared to inorganic EL devices, organic EL devices have superior luminance, lower driving voltage, and quicker response time, and can realize multicolor images.

A typical organic EL device has a stacked structure in the form of an anode/organic emissive layer/cathode structure. Organic EL devices can also have an anode/hole-injection layer (HIL)/hole-transport layer (HTL)/emissive layer/electron-transport layer (ETL)/electron-injection layer (EIL)/cathode structure, or an anode/HIL/HTL/emissive layer/hole-blocking layer/ETL/EIL/cathode structure.

Materials used in organic EL devices can be classified into vacuum deposition materials and solution coating materials. Vacuum deposition materials should be able to have a vapor pressure of $10^{-6}$ torr or higher and may be small molecular materials having a molecular weight of 1200 or less. Solution coating materials should have sufficient solubility and usually include aromatic compounds or heterocyclic compounds.

Manufacturing organic EL devices using vacuum deposition increases costs due to the use of a vacuum system. In addition, when shadow mask is used to manufacture pixels for natural color display, manufacturing high resolution pixels is difficult.

On the other hand, manufacturing organic EL devices using solution coating methods such as inkjet printing, screen printing and spin coating is easy, costs less, and can accomplish relatively higher resolution than using shadow mask.

However, in terms of thermostability and color purity, blue light emitting molecules of solution coating materials are inferior to vacuum deposition materials. Also, as crystallization occurs after manufacturing, crystals as large as wavelengths of visible light disperse visible light and cause white residue. In addition, pinholes are formed and deteriorate the devices.

Japanese Patent No. 1999-003782 discloses two naphthyl-substituted anthracene compounds as compounds for emissive layers or hole injection layers. Also, Japanese Patent Nos. 2004-091334 and 2003-146951 disclose a triphenylamine-substituted anthracene compound for emissive layers or hole injection layers. However, solvent solubility of the above two compounds are not high enough to form layers and thus features of the resulting organic EL devices using the above two compounds are not satisfactory.

Thus, an organic EL device using blue light emitting compounds which are thermostable and suitable for forming layers, which has low driving voltage, superior luminance, high efficiency and superior color purity, is required.

SUMMARY OF THE INVENTION

According to an aspect of the present embodiment, there is provided an organic light-emitting compound represented by Formula 1 below:

<Formula 1>

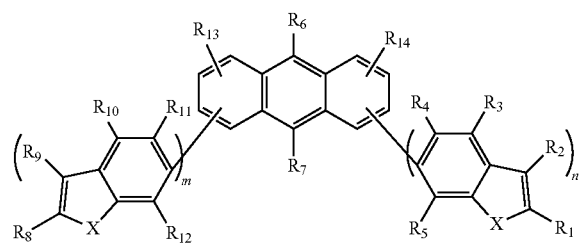

where $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ are each independently selected from the group consisting of hydrogen, halogen, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group or —N $(Z_1)(Z_2)$ or —Si $(Z_3)(Z_4)(Z_5)$, wherein $Z_1$, $Z_2$, $Z_3$, $Z_4$ and $Z_5$ are each independently selected from the group consisting of hydrogen, a substituted or unsubstituted $C_1$-$C_{50}$ alkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group, a substituted or unsubstituted $C_5$-$C_{50}$ cycloalkyl group, or a substituted or unsubstituted $C_5$-$C_{50}$ heterocycloalkyl group;

X is C $(Z_6)(Z_7)$, N($Z_8$), O, S, $SO_2$, Se, or $SeO_2$, wherein $Z_6$, $Z_7$ and $Z_8$ are each independently selected from the group consisting of hydrogen, a substituted or unsubstituted $C_1$-$C_{50}$ alkyl group, or a $C_6$-$C_{50}$ aryl group; and m and n are each independently 0, 1 or 2, but not concurrently 0.

According to another aspect of the present invention, there is provided an organic electroluminescent (EL) device, including a first electrode; a second electrode; and at least one organic layer between the first electrode and the second electrode, wherein the organic layer includes the compound represented by Formula 1.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein:

FIGS. 1A, 1B and 1C illustrate sectional views of organic electroluminescent (EL) devices according to embodiments of the present invention.

DETAILED DESCRIPTION OF THE INVENTION

Figure 2:
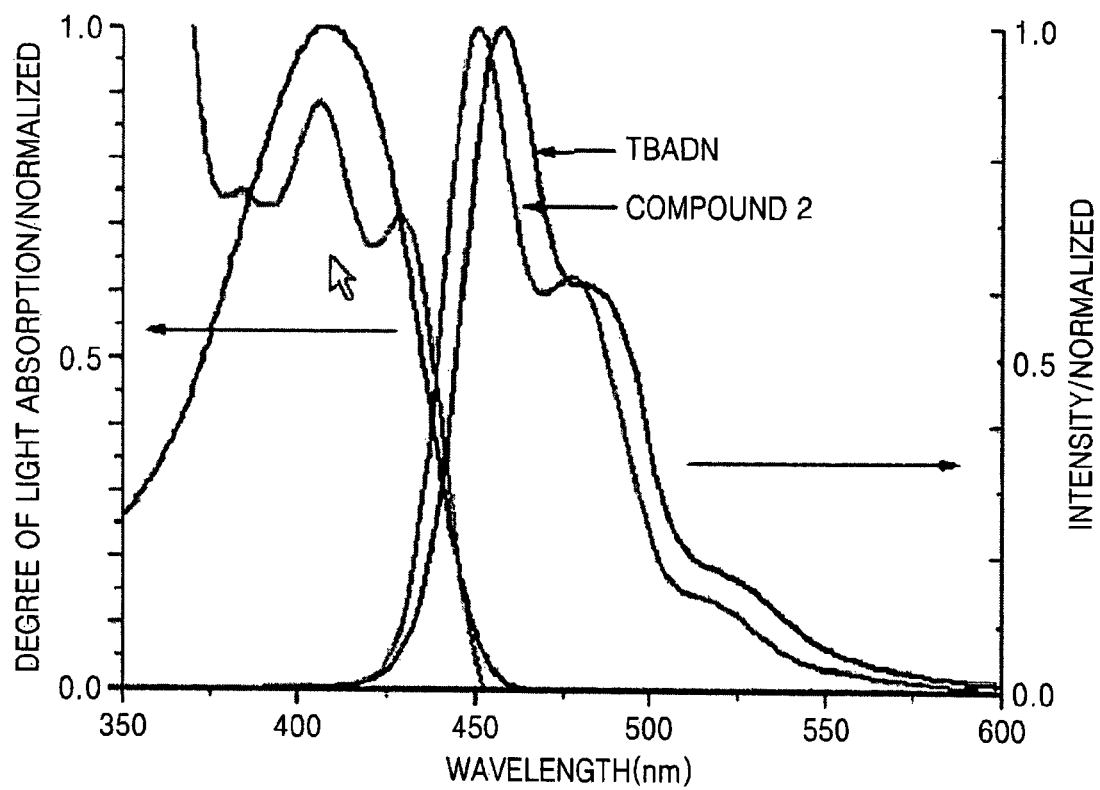
FIG. 2 is a graph showing light absorption spectra and photoluminescence (PL) spectra of films of Example 1 and Comparative Example 1 according to embodiments of the present invention.

Hereinafter, the present invention will be described in detail by explaining embodiments of the invention with reference to the attached drawings.

According to an embodiment of the present invention, an organic light-emitting compound represented by Formula 1 below is provided.

<Formula 1>

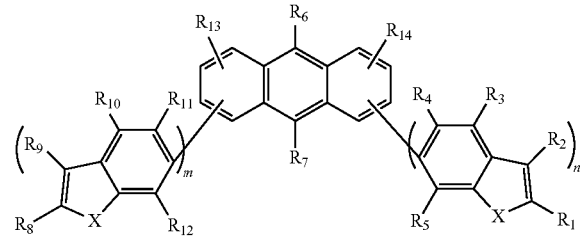

where $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ are each independently selected from the group consisting of hydrogen, halogen, a cyano group, a nitro group, a hydroxyl group, a substituted or unsubstituted $C_1$-$C_{50}$alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group or —N($Z_1$)($Z_2$) or —Si ($Z_3$)($Z_4$)($Z_5$), wherein $Z_1$, $Z_2$, $Z_3$, $Z_4$ and $Z_5$ are each independently selected from the group consisting of hydrogen, a substituted or unsubstituted $C_1$-$C_{50}$ alkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group, a substituted or unsubstituted $C_5$-$C_{50}$ cycloalkyl group, or a substituted or unsubstituted $C_5$-$C_{50}$ heterocycloalkyl group;

X is C ($Z_6$)($Z_7$), N($Z_8$), O, S, $SO_2$, Se, or $SeO_2$, wherein $Z_6$, $Z_7$ and $Z_8$ are each independently selected from the group consisting of hydrogen, a substituted or unsubstituted $C_1$-$C_{50}$ alkyl group, or a $C_6$-$C_{50}$aryl group; and m and n are each independently 0, 1 or 2, but not concurrently 0.

In Formula 1, an anthracene core and heteroaryl groups such as benzothiophene which are linked to the anthracene core increase thermostability and photochemical stability of the compound represented by Formula 1, and improve properties of organic EL devices such as life span. In addition, the inter-linked anthracene cores and bulky irregular substituent groups, such as benzothiophene, improve light-emitting properties such as quantum efficiency by allowing intra-molecular energy transfers.

The cycloalkyl group is defined as an alkyl group which has a ring system. The heterocycloalkyl group is defined as a group where at least one of the carbons in the ring of the cycloalkyl group is at least one element other than carbon, preferably selected from the group consisting of N, O, S and P. The aryl group includes aromatic ring systems which can include single, two or more ring systems. The two or more ring systems can be joined or fused. The heteroaryl group is defined as a group where at least one carbon in the ring of the aryl group is at least one element other than carbon, preferably selected from the group consisting of N, O, S and P.

When the alkyl group, the alkoxy group, the aryl group, the heteroaryl group, the cycloalkyl group and the heterocycloalkyl group are substituted, the substituent group can be at least one selected from the group consisting of —F; —Cl; —Br; —CN; —NO$_2$; —OH; a $C_1$—$C_{50}$ alkyl group which is unsubstituted or substituted with —F, —Cl, —Br, —CN, —NO$_2$ or —OH; a $C_1$-$C_{50}$ alkoxy group which is unsubstituted or substituted with —F, —Cl, —Br, —CN, —NO$_2$ or —OH; a $C_6$-$C_{50}$ aryl group which is unsubstituted or substituted with a $C_1$-$C_{50}$ alkyl group, a $C_1$-$C_{50}$ alkoxy group, —F, —Cl, —Br, —CN, —NO$_2$ or —OH; a $C_2$-$C_{50}$ heteroaryl group which is unsubstituted or substituted with a $C_1$-$C_{50}$ alkyl group, a $C_1$-$C_{50}$ alkoxy group, —F, —Cl, —Br, —CN, —NO$_2$ or —OH; a $C_5$-$C_{50}$ cycloalkyl group which is unsubstituted or substituted with a $C_1$-$C_{50}$ alkyl group, a $C_1$-$C_{50}$ alkoxy group, —F, —Cl, —Br, —CN, —NO$_2$ or —OH; a $C_5$-$C_{50}$ heterocycloalkyl group which is unsubstituted or substituted with a $C_1$-$C_{50}$ alkyl group, a $C_1$-$C_{50}$ alkoxy group, —F, —Cl, —Br, —CN, —NO$_2$ or —OH; and a group which is represented as —N($Z_9$)($Z_{10}$), wherein $Z_9$ and $Z_{10}$ can be each independently hydrogen; a $C_1$-$C_{50}$ alkyl group; or a $C_6$-$C_{50}$ aryl group which is substituted with a $C_1$-$C_{50}$ alkyl group.

More particularly, $R_1$ through $R_{14}$ can be each independently selected from the group consisting of hydrogen, a $C_1$-$C_{50}$ alkyl group, a $C_1$-$C_{50}$ alkoxy group, a phenyl group, a biphenyl group, a pentalenyl group, an indenyl group, a naphthyl group, a biphenylenyl group, an anthracenyl group, an azulenyl group, a heptalenyl group, an acenaphthalenyl group, a phenalenyl group, a fluorenyl group, a methylanthryl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a fluorenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, an oxiranyl group, a pyrrolidinyl group, a pyrazolidinyl group, an imidazolidinyl group, a piperidinyl group, a piperazinyl group, a morpholinyl group, a di($C_6$-$C_{50}$ aryl)amino group, a tri($C_6$-$C_{50}$ aryl)silyl group and derivatives thereof.

The term "derivatives" in the present specification indicates groups in which at least one hydrogen of the listed groups is substituted with one of the above substituents. Those substituent groups may be a methyl group, a methoxy group, a phenyl group, a tolyl group, a naphthyl group, a pyrenyl group, a phenanthrenyl group, a fluorenyl group, an imidazolinyl group, an indolyl group, a quinolinyl group, a diphenylamino group, a 2,3-di-p-tolylaminophenyl group and a triphenylsilyl group.

X is $C(Z_6)(Z_7)$, $N(Z_8)$, O, S, $SO_2$, Se, or $SeO_2$, wherein $Z_6$, $Z_7$ and $Z_8$ are each independently hydrogen, a substituted or unsubstituted $C_1$-$C_{50}$ alkyl group or a $C_6$-$C_{50}$ aryl group, and may be $CH_2$, $C(CH_3)_2$, $C(C_6H_5)_2$, NH, N—$CH_3$, N—$C_6H_5$, O, $SO_2$ or S.

More particularly, structures of organic light-emitting compounds according to embodiments of the present invention can be represented by Formulae 2 through 29 below but are not limited thereto:

<Formula 2>

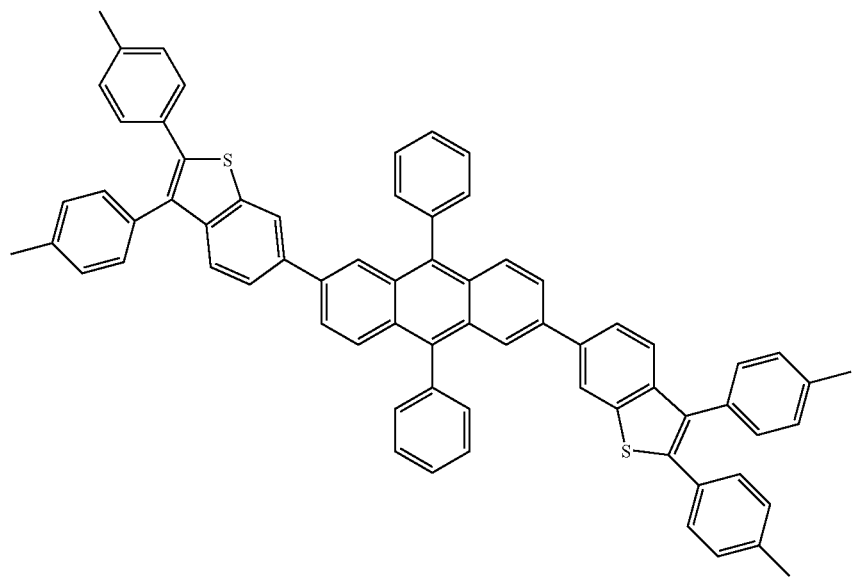

<Formula 3>

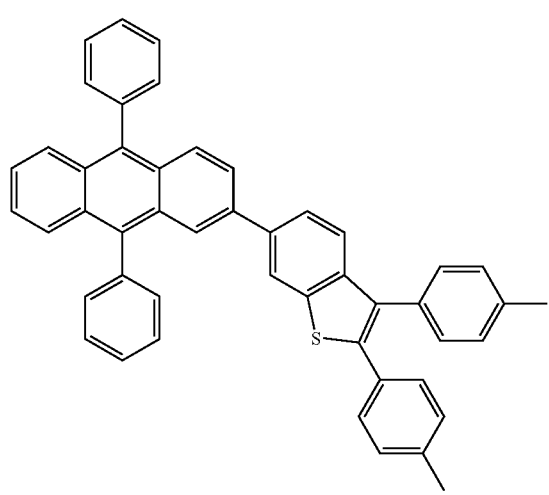

<Formula 4>

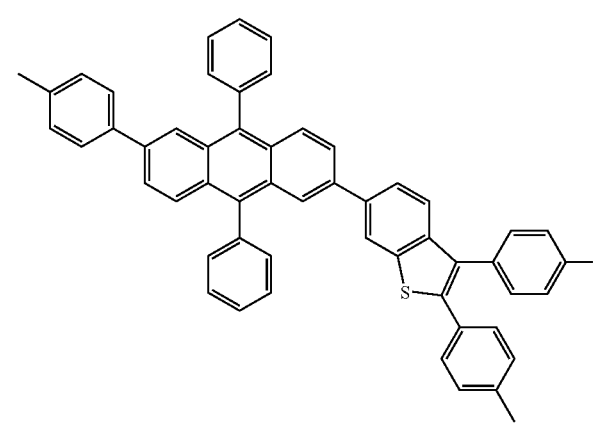

<Formula 5>
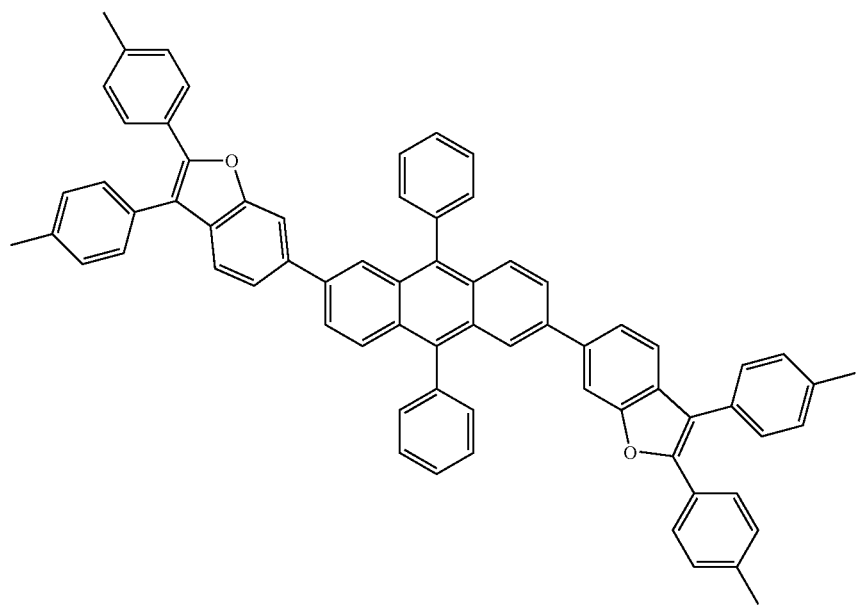
<Formula 6>
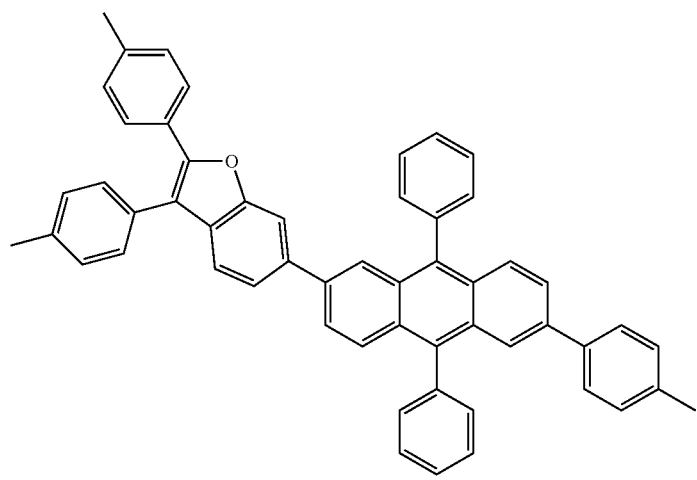
<Formula 7>
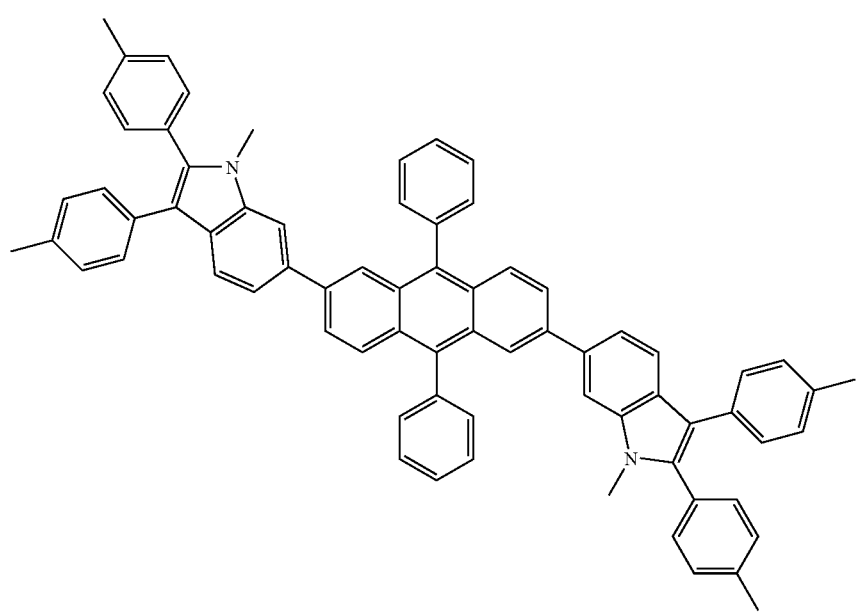

-continued
<Formula 8>
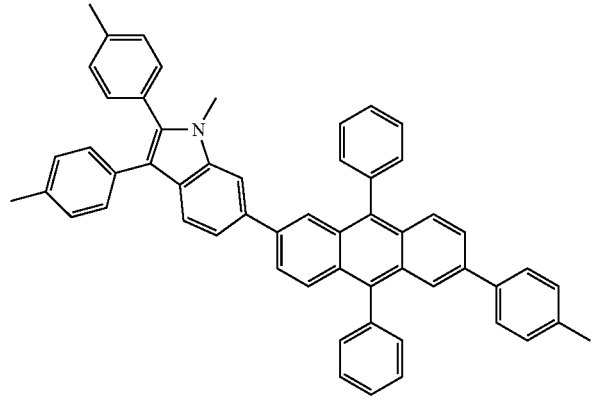
<Formula 9>
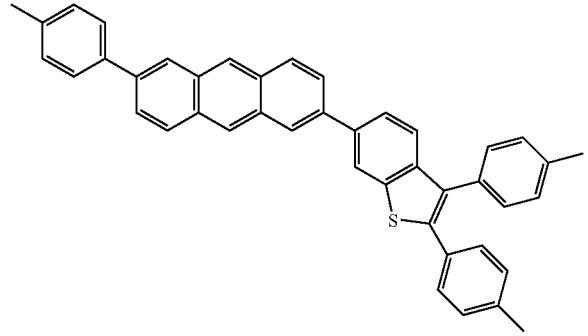
<Formula 10>
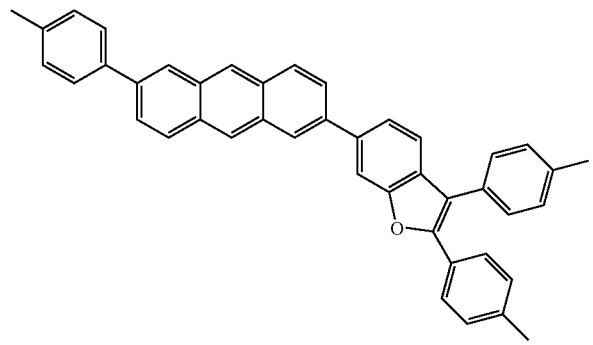
<Formula 11>
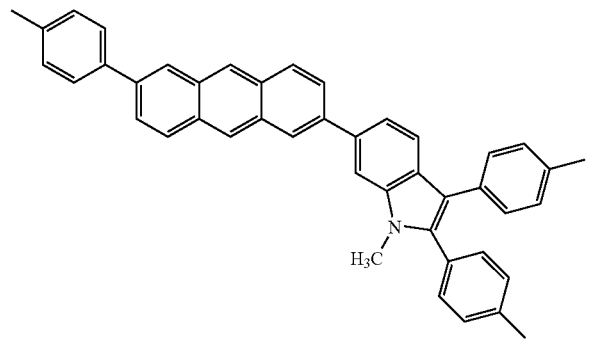
<Formula 12>
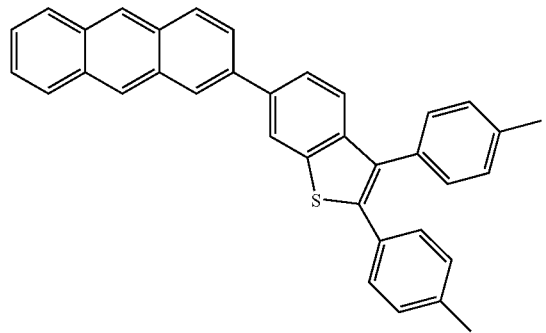
<Formula 13>
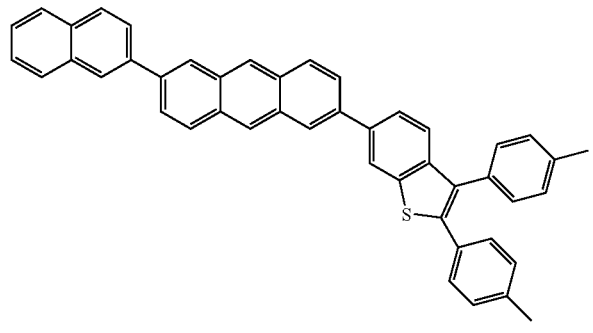

-continued
<Formula 14>
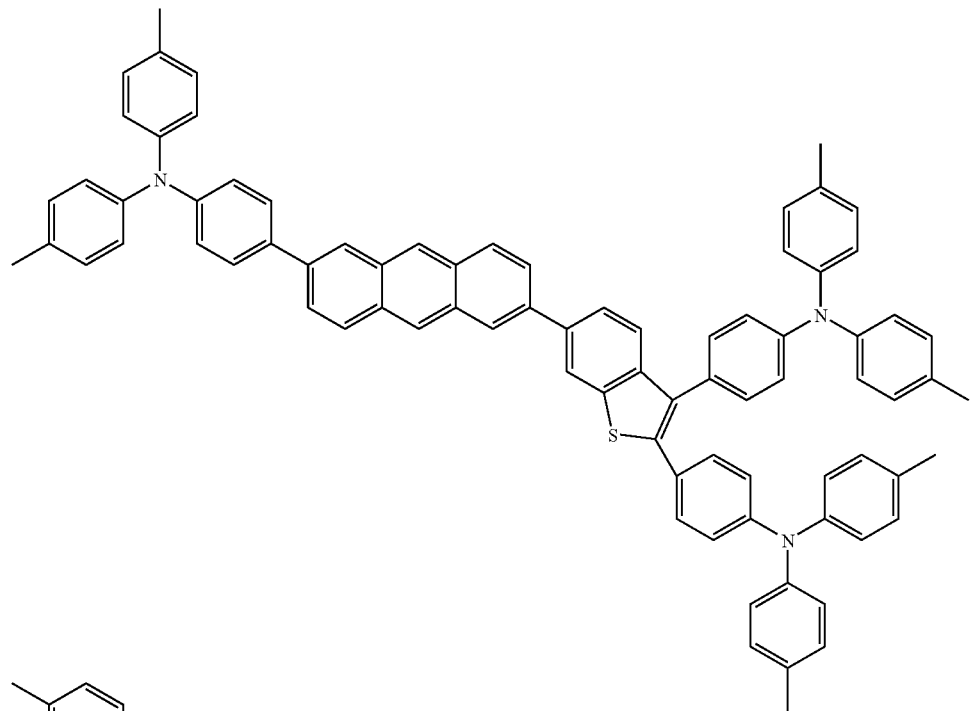
<Formula 15>
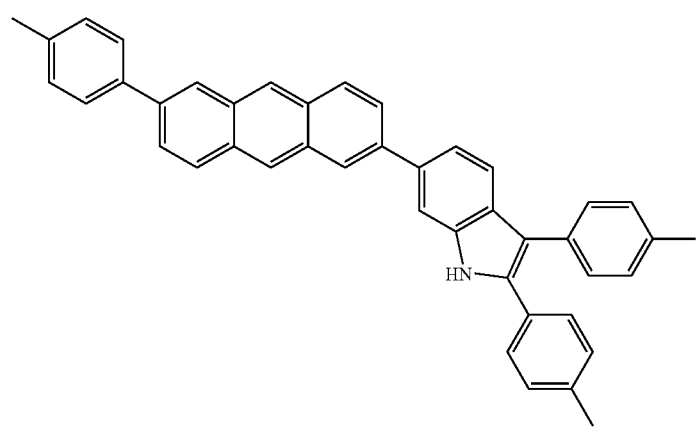
<Formula 16>
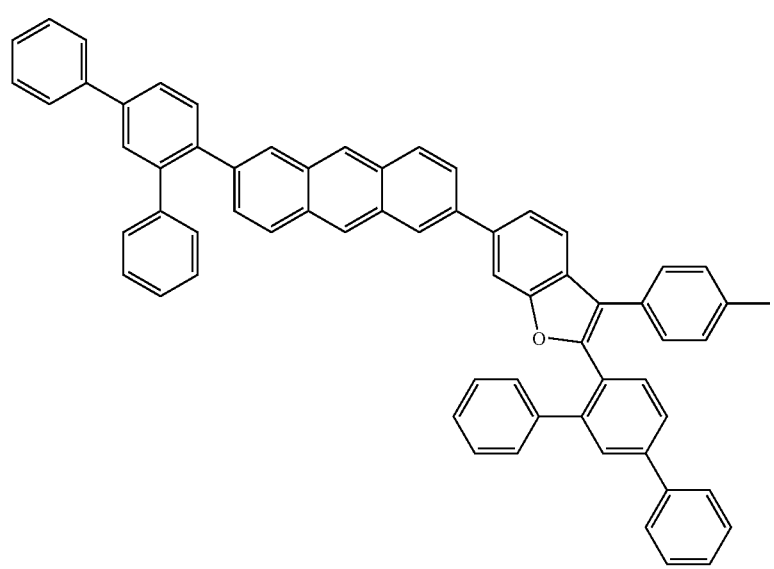

<Formula 17>
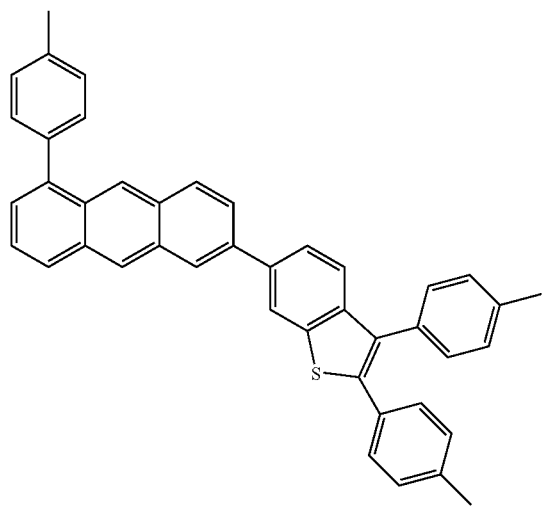
<Formula 18>
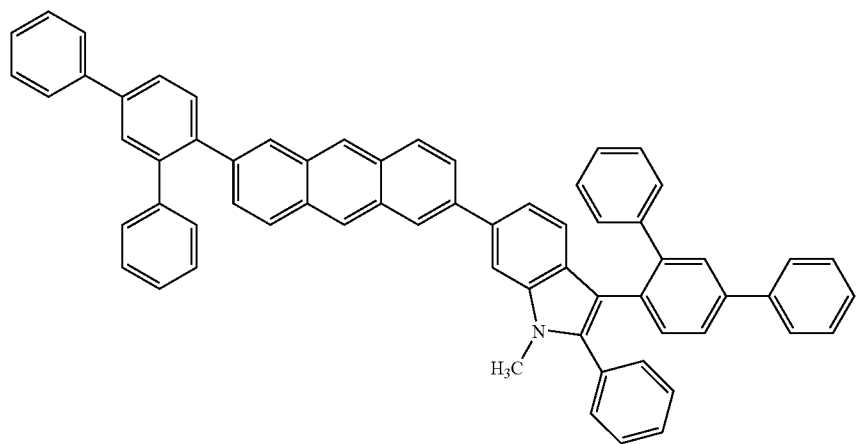
<Formula 19>
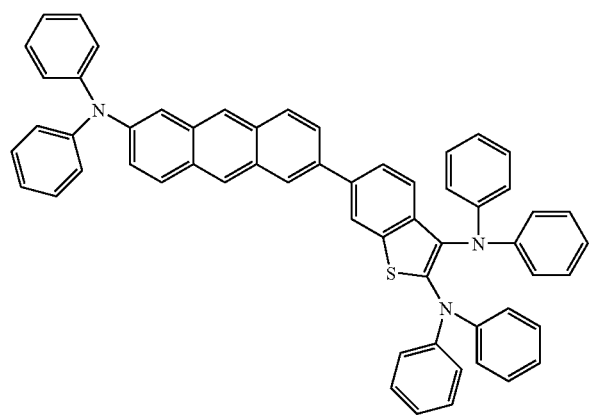
<Formula 20>
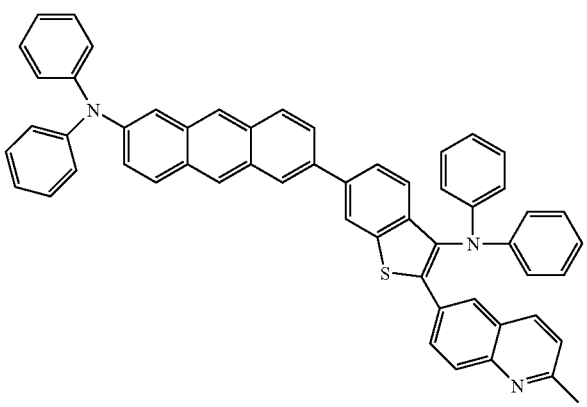

-continued
<Formula 21>
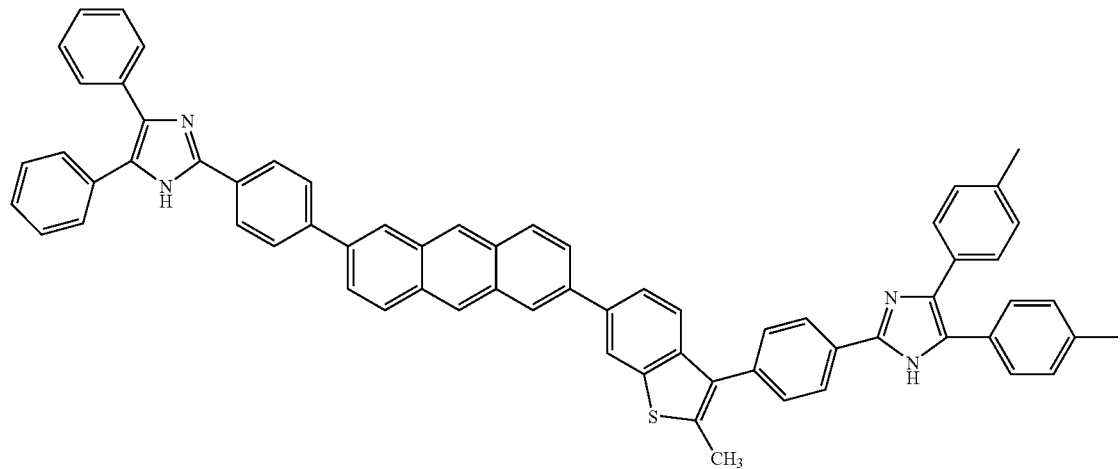
<Formula 22>
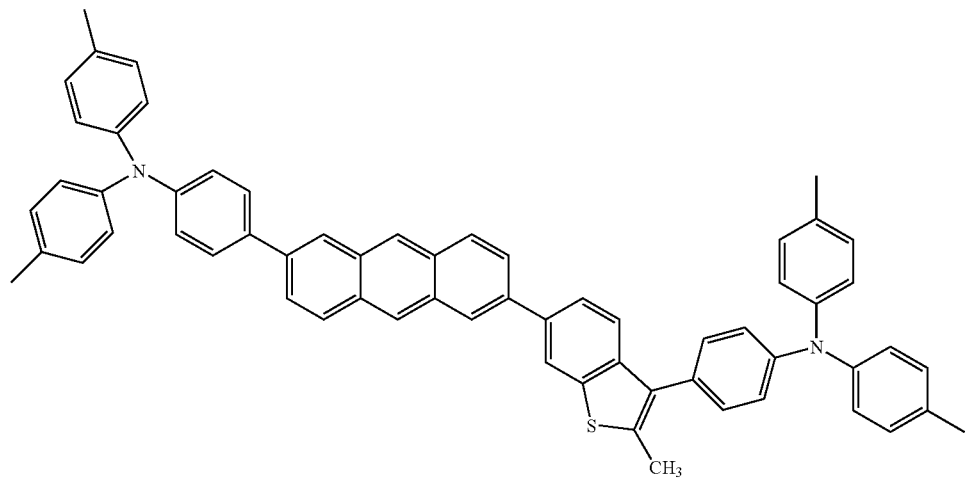
<Formula 23>
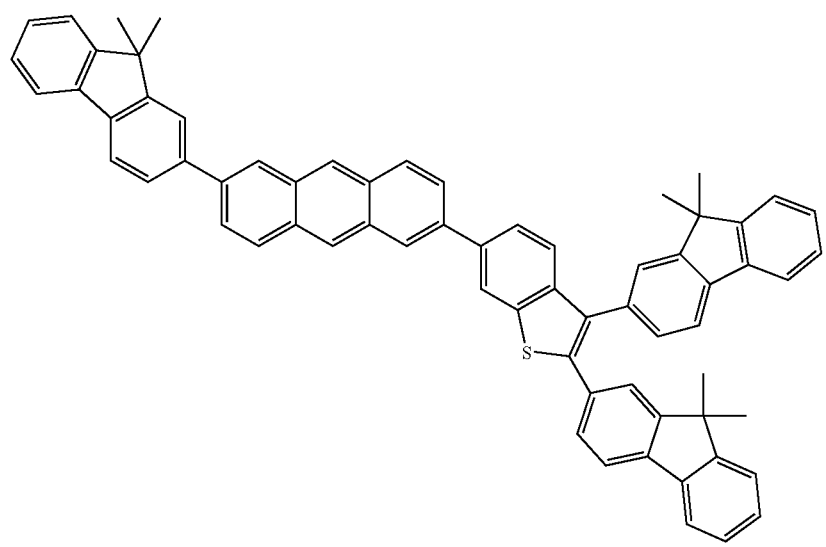

<Formula 24>
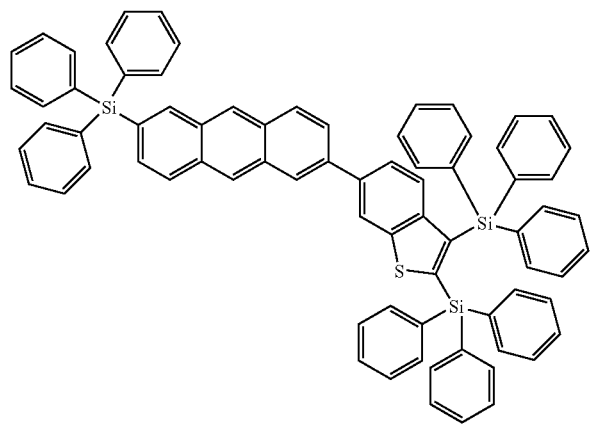
<Formula 25>
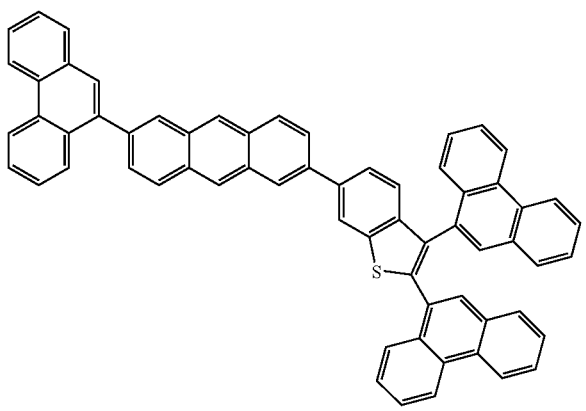
<Formula 26>
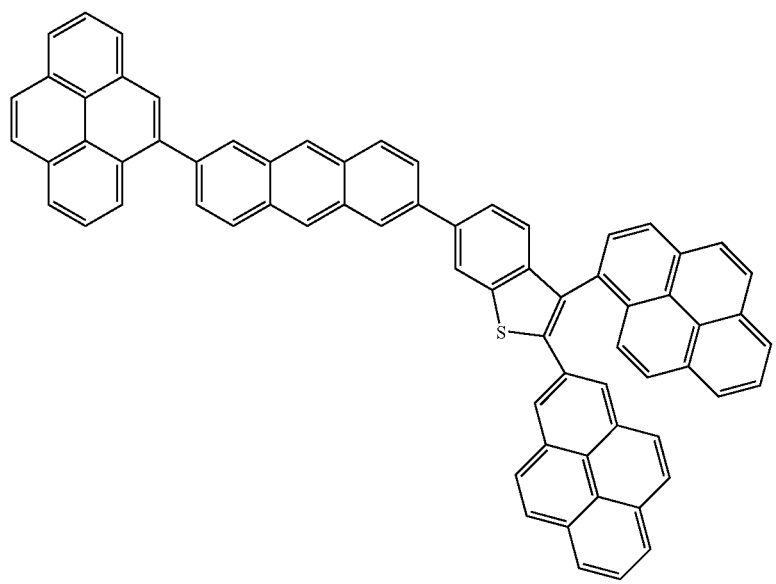
<Formula 27>
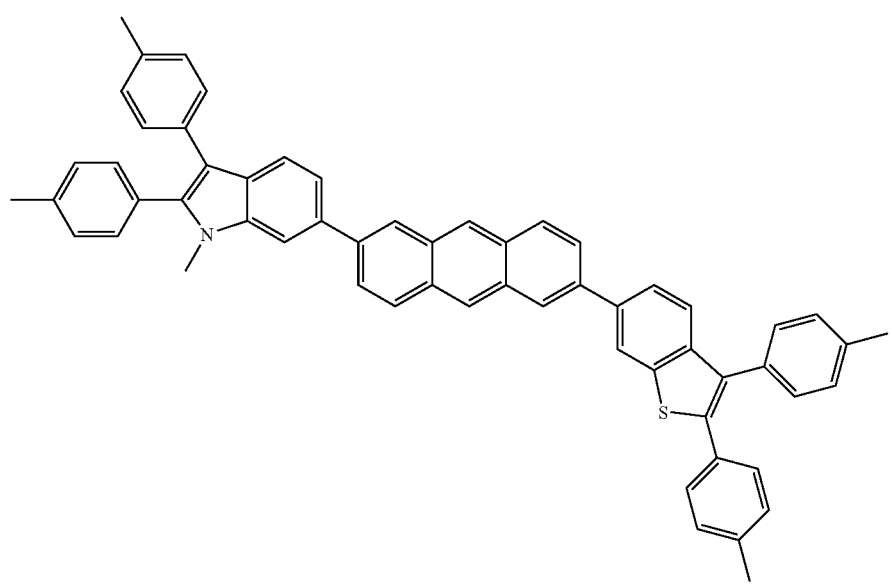

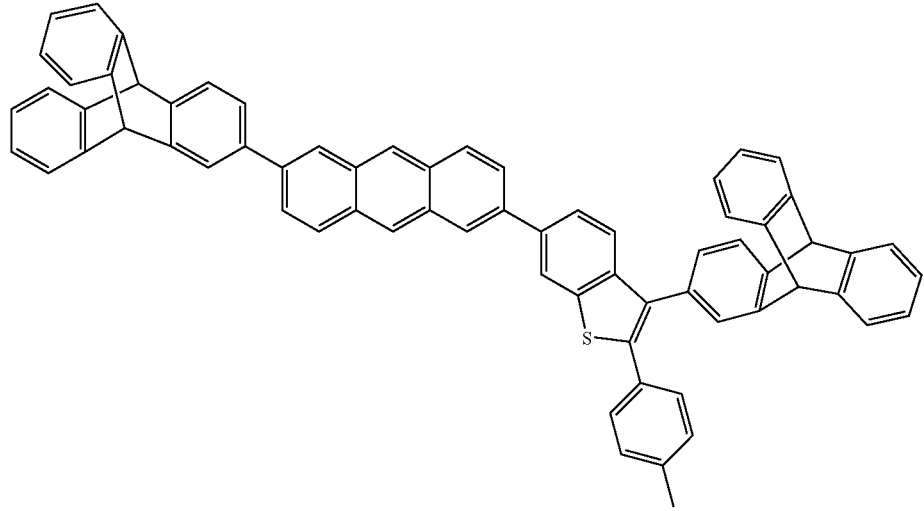

<Formula 28>

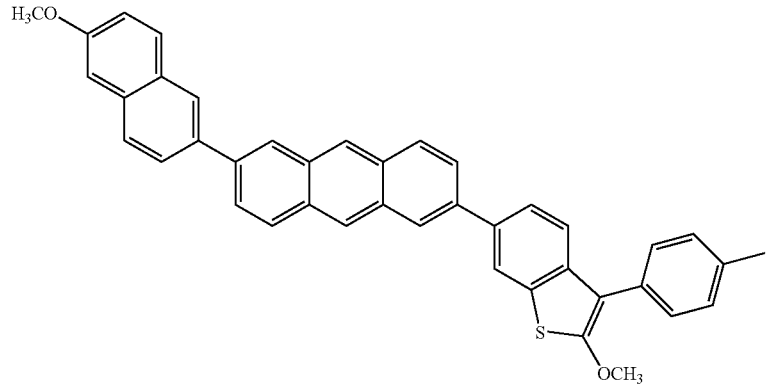

<Formula 29>

The compound represented by Formula 1 can be synthesized using common synthesis methods. Exemplary synthesis paths of the compound are explained in Example.

According to another embodiment of the present invention, there is provided an organic electroluminescent (EL) device including a first electrode, a second electrode, and organic layers between the first electrode and the second electrode, wherein the organic layers include one or more compounds represented by Formula 1:

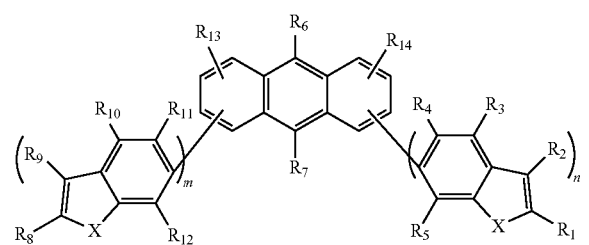

<Formula 1> where $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ are each independently selected from the group consisting of hydrogen, halogen, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group or —N$(Z_1)(Z_2)$ or —Si $(Z_3)(Z_4)(Z_5)$, wherein $Z_1$, $Z_2$, $Z_3$, $Z_4$ and $Z_5$ are each independently selected from the group consisting of hydrogen, a substituted or unsubstituted $C_1$-$C_{50}$ alkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group, a substituted or unsubstituted $C_5$-$C_{50}$ cycloalkyl group, or a substituted or unsubstituted $C_5$-$C_{50}$ heterocycloalkyl group;

X is C $(Z_6)(Z_7)$, N$(Z_8)$, O, S, SO$_2$, Se, or SeO$_2$, wherein $Z_6$, $Z_7$ and $Z_8$ are each independently selected from the group consisting of hydrogen, a substituted or unsubstituted $C_1$-$C_{50}$ alkyl group, or a $C_6$-$C_{50}$ aryl group; and m and n are each independently 0, 1 or 2, but not concurrently 0.

The compound represented by Formula 1 is suitable for being used in organic layers of organic EL devices, in particular, emissive layers, hole injection layers, or hole transport layers.

Unlike the conventional organic EL devices having low stability when manufactured using solution coating methods, the organic EL device according to an embodiment of the present invention includes organic light-emitting compounds that have excellent solubility and thermostability and can form stable organic layers, so that the organic EL device can provide improved properties such as excellent turn-on voltage, color purity and the like.

An organic EL device according to an embodiment of the present invention can further include at least one layer selected from the group consisting of a hole injection layer, a hole transport layer, a hole blocking layer, an electron blocking layer, an electron transport layer and an electron injection layer, and which is located between the first electrode and the second electrode.

FIGS. 1A, 1B and 1C illustrate sectional views of organic electroluminescent (EL) devices according to embodiments of the present invention.

The organic EL device illustrated in FIG. 1A has a first electrode/hole injection layer/emissive layer/electron transport layer/electron injection layer/second electrode structure. The organic EL device illustrated in FIG. 1B has a first electrode/hole injection layer/hole transport layer/emissive layer/electron transport layer/electron injection layer/second electrode structure. The organic EL device illustrated in FIG. 1C has a first electrode/hole injection layer/hole transport layer/emissive layer/hole blocking layer/electron transport layer/electron injection layer/second electrode structure. At least one layer of the above emissive layers, the hole injection layers and the hole transport layers can include organic light-emitting compounds according to embodiments of the present invention.

Emissive layers of organic EL devices according to embodiments of the present invention can include phosphorescent or fluorescent dopants or hosts including red, green, blue or white wherein the phosphorescent dopant can be an organic metal compound including at least one element selected from the group consisting of Ir, Pt, Os, Ti, Zr, Hf, Eu, Tb and Tm.

Hereinafter, a method of manufacturing an organic EL device according to an embodiment of the present invention is presented with reference to the organic EL device illustrated in FIG. 1C.

First, the first electrode, which can be used as an anode, is formed on a substrate by depositing or sputtering first electrode forming materials. The substrate can be any substrate used in conventional organic light-emitting devices, and may be a glass substrate or a transparent plastic substrate, which has superior mechanical strength, thermostability, transparency, surface smoothness, ease of treatment and waterproofness. The first electrode can be formed of ITO, IZO, SnO$_2$, ZnO, or the like, which are transparent and highly conductive.

Then the hole injection layer (HIL) can be formed on the first electrode using vacuum deposition, spin coating, casting, Langmuir Blodgett (LB), or the like.

When vacuum deposition is used to form the HIL, deposition conditions may vary according to the compound being used, and the structure and thermal properties of the HIL to be formed. In general, however, conditions for vacuum deposition may be in a temperature range of 50° C. to 500° C., a pressure of $10^{-8}$ torr to $10^{-3}$ torr, a deposition speed of 0.01 to 100 Å/sec, and a layer thickness of 10 Å to 5 µm.

When spin coating is used to form the HIL, coating conditions may vary according to the compound being used, and the structure and thermal properties of the HIL to be formed. In general, however, conditions for spin coating may be in a coating speed range of about 2,000 through 5,000 rpm, and a heat treatment temperature of about 80 through 200° C. to remove the solvent after coating.

The HIL may be formed of the compound represented by Formula 1. However, the HIL can also be formed of known hole injection materials including phthalocyanine compounds such as copper phthalocyanine which is disclosed in U.S. Pat. No. 4,356,429 which is incorporated herein by reference, star-burst type amine derivatives such as TCTA, m-MTDATA, and m-MTDAPB which are disclosed in Advanced Material, 6, p. 677 (1994) which is incorporated herein by reference, or soluble conductive polymers such as Pani/DBSA (Polyaniline/Dodecylbenzenesulfonic acid) or PEDOT/PSS (Poly (3,4-ethylenedioxythiophene)/Poly(4-styrenesulfonate), Pani/CSA (Polyaniline/Camphor sulfonic acid) or PANI/PSS (Polyaniline)/Poly (4-styrenesulfonate)).

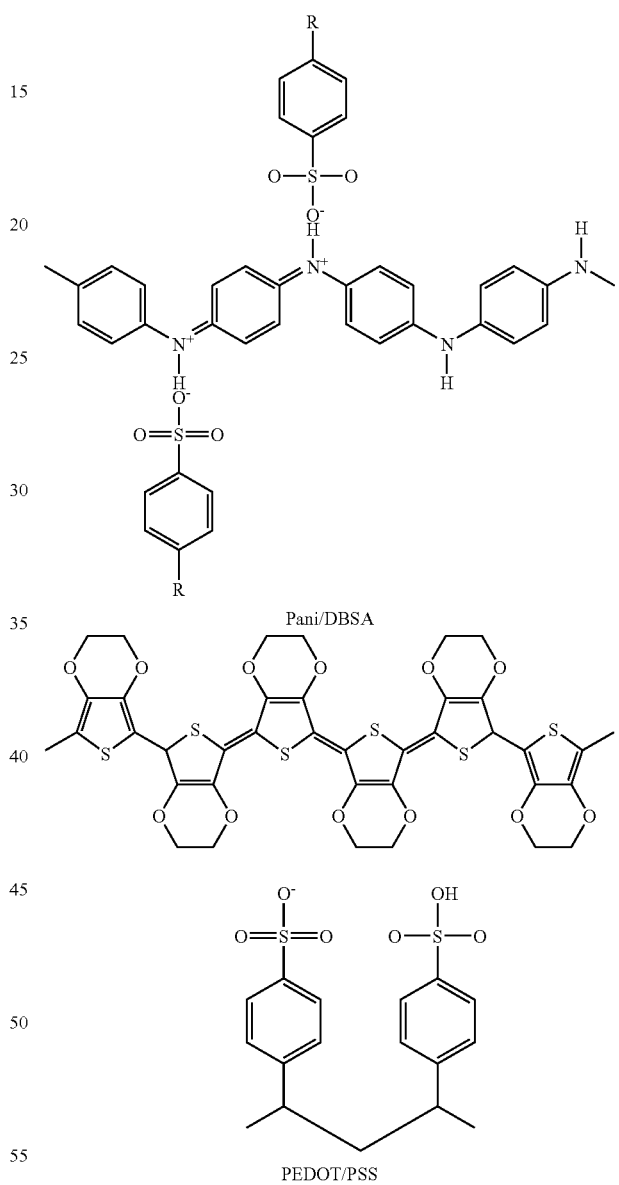

Pani/DBSA

PEDOT/PSS

The thickness of the HIL is about 100 through 10,000 Å, and may be 100 through 1,000 Å. When the thickness of the HIL is less than 100 Å, hole injection properties can deteriorate. When the thickness of the HIL is greater than 10,000 Å, driving voltage can increase.

Then the hole transport layer (HTL) can be formed on the HIL using vacuum deposition, spin coating, casting, Langmuir Blodgett (LB), or the like.

When vacuum deposition or spin coating is used to form the HTL, deposition or coating conditions may vary according to the compound used. In general, however, the deposition or coating conditions used to form the HIL are also used to form the HTL.

The HTL can be formed of the compound represented by Formula 1. The HTL can also be formed of known hole transport materials, for example, carbazole derivatives such as N-phenylcarbazole, and polyvinylcarbazole, or typical amine derivatives with aromatic fused rings such as N,N'-bis (3-methylphenyl)—N,N'-diphenyl-[1,1-biphenyl]-4,4'-diamine (TPD) and N,N'-di(naphthalene-1-yl)—N,N'-diphenyl benzidine (α-NPD).

The thickness of the HTL is about 50 through 1,000 Å, and may be 100 through 600 Å. When the thickness of the HTL is less than 50 Å, hole transport properties can deteriorate. When the thickness of the HTL is greater than 1,000 Å, driving voltage can increase.

Then the emissive layer (EML) can be formed on the HTL using vacuum deposition, spin coating, casting, Langmuir Blodgett (LB), or the like.

When vacuum deposition or spin coating is used to form the EML, the deposition or coating conditions may vary according to the compound used. In general, however, deposition or coating conditions used to form the HIL are used to form the EML.

The EML can include the compound represented by Formula 1 according to an embodiment of the present invention. The compound represented by Formula 1 can be used with known host materials, or with known fluorescent or phosphorescent dopant materials. The compound represented by Formula 1 can also be used without host material or dopant material.

The host materials can be Alq3, CBP (4,4'-N,N'-dicabazole-biphenyl), or PVK (poly(n-vinylcabazole)). The fluorescent dopant materials can be DPAVBi, IDE102 or IDE105, which are available from Idemitsu Corporation, or C545T, which are available from Hayashibara Corporation. The phosphorescent dopants can be PtOEP and RD 61 of UDC Corporation as red dopants, Ir(PPy)3(PPy=2-phenylpyridine) as green dopants, F2Irpic as blue dopants. Formula 30 below represents the structure of TBADN which can be used as a host.

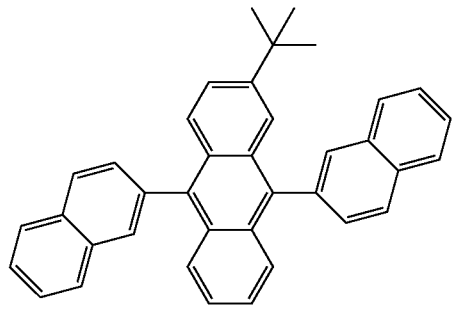

<Formula 30>

The doping concentration is not particularly limited. Preferably, the amount of dopant is usually from 0.01 to 15 parts by weight based on 100 parts by weight of the host.

The thickness of the EML is about 100 through 1,000 Å, and may be 200 through 600 Å. When the thickness of the EML is less than 100 Å, emissive properties can deteriorate. When the thickness of the EML is greater than 1,000 Å, driving voltage can increase.

When phosphorescent dopants are co-used in the EML, a hole blocking layer (HBL) can be formed on the hole transport layer (HTL) using vacuum deposition, spin coating, casting, Langmuir Blodgett (LB), or the like to prevent triplet excitons or holes from diffusing to the electron transport layer (ETL).

When vacuum deposition or spin coating is used to form the HBL, deposition or coating conditions can vary according to the compounds being used. In general, however, the deposition or coating conditions used to form the HIL are used to form the HBL. Known hole blocking materials such as oxadiazole derivatives, triazole derivatives, phenanthroline derivatives, and BCP can be used to form the HBL.

The thickness of the HBL may be about 50 through 1,000 Å, and preferably 100 through 300 Å. When the thickness of the HBL is less than 50 Å, hole-blocking properties can deteriorate. When the thickness of the HBL is greater than 1,000 Å, turn-on voltage can increase.

Then the electron transport layer (ETL) can be formed on the HBL using vacuum deposition, spin coating, casting, or the like.

When vacuum deposition or spin coating is used to form the ETL, deposition or coating conditions can vary according to the compounds being used. In general, however, the deposition or coating conditions used to form the HIL are used. Known electron transport materials such as quinoline derivatives, in particular, tris(8-quinolinorate)aluminium (Alq3), TAZ, and Balq can be used to form the ETL.

The thickness of the ETL may be about 100 through 1,000 Å, and preferably 200 through 500 Å. When the thickness of the ETL is less than 100 Å, electron-transporting properties can deteriorate. When the thickness of the ETL is greater than 1,000 Å, driving voltage can increase.

Then the electron injection layer (EIL) can be formed on the ETL. Known electron injection layer forming materials such as LiF, NaCl, CsF, Li2O, and BaO can be used to form the EIL, but the present invention is not limited thereto.

Deposition conditions used to form the EIL can vary according to the compounds being used. In general, however, the deposition conditions used to form the HIL are used to form the EIL.

The thickness of the EIL may be about 1 through 100 Å, and preferably 5 through 50 Å. When the thickness of the EIL is less than 1 Å, electron-injection properties can deteriorate. When the thickness of the EIL is greater than 100 Å, driving voltage can increase.

Finally, the second electrode, which can be used as a cathode, can be formed on the EIL using vacuum deposition, sputtering, or the like. The second electrode can be formed of metals having a low work function, alloys, electrically conductive compounds and compounds thereof. For example, Li, Mg, Al, Al—Li, Ca, Mg—In, Mg—Ag can be used to form the second electrode. Alternatively a transparent cathode formed of ITO or IZO can be employed in front-emission type organic EL devices.

Hereinafter, the present invention will be described more specifically with reference to the following synthesis examples. However, the following synthesis examples are provided only for illustrative purposes only and are not intended to limit the scope of the invention.

EXAMPLE

Synthesis Example 1

Synthesis of Compound 2

[Reaction Scheme 1]

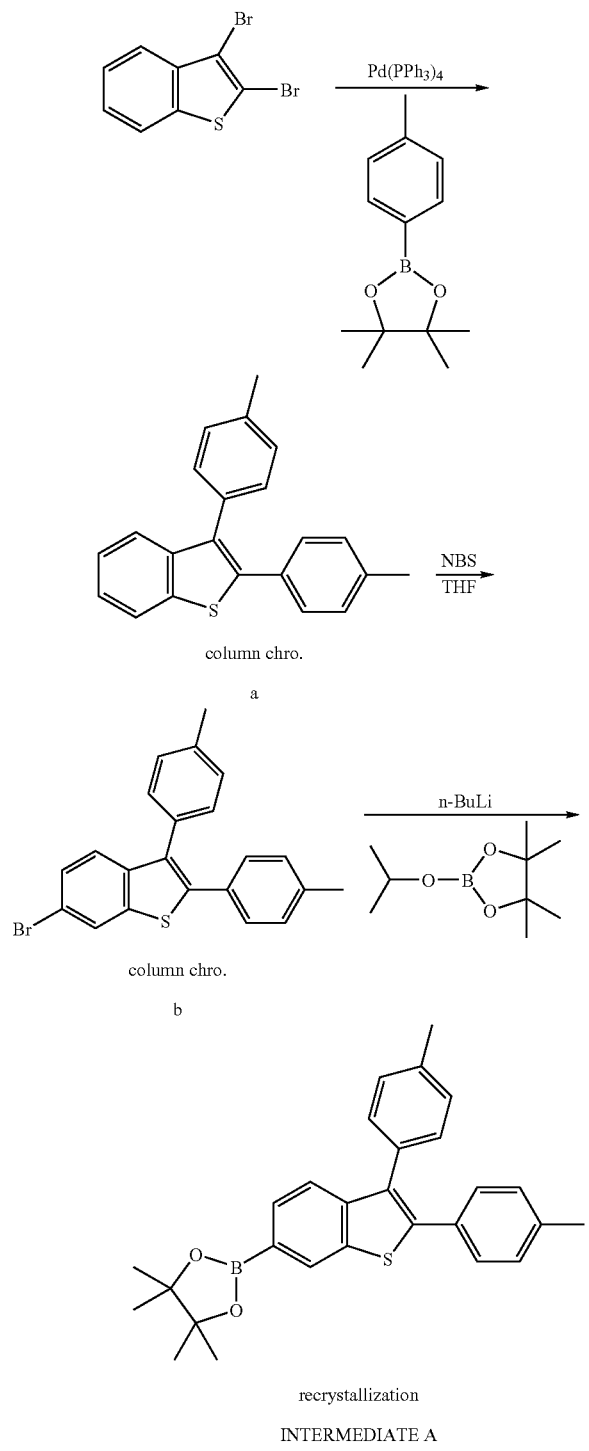

Preparation of 2,3-di-tolyl-benzo[b]thiophene (a):

Under argon atmosphere, 3.0 g (10.27 mmol) of 2,3-dibromo-benzo[b]thiophene, 4.89 g (35.95 mmol) of p-tolyl-boronic acid, 2.39 g (22.59 mmol) of $Na_2CO_3$, and 0.36 g (0.31 mmol) of tetrakis (triphenylphosphine)palladium (Pd $(PPh_3)_4$) were put in a 500 ml round-bottomed flask. 5 ml of tetrahydrofuran (THF) and 2.2 ml of water were added thereto and refluxed at a temperature of 85° C. for 2 hours. After the color of the mixture solution changed to dark brown, water was added. Then an organic layer was extracted with ethyl acetate. The extracted organic layer was dried with anhydride magnesium sulfate, filtered, and removed of solvent. Then the organic layer was dissolved in a small amount of toluene, and refined through column chromatography (silica, hexane), thereby producing a solid pre-product. The solid pre-product was recrystallized with toluene and methanol, thereby producing 2.8 g of a white solid product with a yield of 87%.

$^1$H—NMR ($CDCl_3$, 300 MHz): 7.80 (d, 2H), 7.64-7.49 (m, 8H), 7.43-7.39 (m, 4H), 7.38 (d, 1H), 7.34 (d, 1H)

Preparation of 6-Bromo-2,3-di-p-tolyl-benzo[b]thiophene (b):

In a 500 ml round-bottomed flask, 2.5 g (7.9 mmol) of 2,3-di-tolyl-benzo[b]thiophene and 14 g (79 mmol) of N-bromosuccinimide (NBS) were dissolved in 200 ml of THF and stirred for an hour. The reaction was ended by adding 100 ml of water. 3 g of white solid product was extracted with a yield of 85%.

Preparation of 2-(2,3-di-p-tolyl-benzo[b]thiophen-6-yl)-4,4,5,5-tetramethyl-[1,3,2]dioxaborolane) (Intermediate A):

Under argon atmosphere, in a 500 ml round-bottomed flask, 5 g (12.75 mmol) of 6-bromo-2,3-di-p-tolyl-benzo[b]thiophene was dissolved in 150 ml of THF, and 6.12 ml (15.31 mmol) of n-BuLi 2.5M (hexane) was added thereto at −78° C. The resulting solution was stirred at −78° C. for 2 hours. Then 3.4 ml (16.58 mmol) of 2-isopropoxy-4,4,5,5-tetramethyl-1, 3,2-dioxaborolane was added thereto and stirred at room temperature for one hour. The reaction was ended by adding 50 ml of water. Then an organic layer was extracted with brine and methylene chloride. The extracted organic layer was dried with anhydride magnesium sulfate, filtered and removed of solvent. The organic layer was purified through chromatography (silica, hexane), and 4.8 g (yield 79%) of white solid product was obtained by increasing the polarity of the developing solvent.

[Reaction Scheme 2]

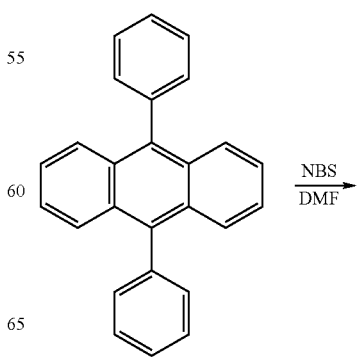

Preparation of (2,6-dibromo-9,10-diphenyl-anthracene) (Intermediate B):

In a 500 ml round-bottomed flask, 3.0 g (9.2 mmol) of 9,10-diphenyl-anthracene (9,10-Diphenyl-anthracene), and 8.2 g (46 mmol) of NBS were dissolved in 60 ml of N-dimethylformamide (DMF) and stirred for three hours. The reaction was ended by adding 30 ml of water. An organic layer was extracted with brine and methylene chloride. The extracted organic layer was dried with anhydride magnesium sulfate, filtered and removed of solvent. The resulting solid pre-product was recrystallized in hexane. The crystals were dissolved in THF and purified through column chromatography (silica, hexane and methylene chloride) to produce 1.4 g of yellow solid Intermediate B with a yield of 32%.

$^1$H-NMR (CDCl$_3$, 300 MHz): 7.80 (d, 2H), 7.64-7.49 (m, 8H), 7.43-7.39 (m, 4H), 7.38 (d, 1H), 7.34 (d, 1H)

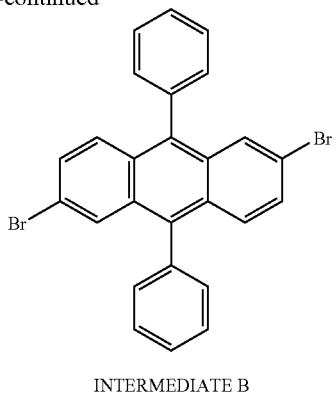

INTERMEDIATE B

[Reaction Scheme 3]

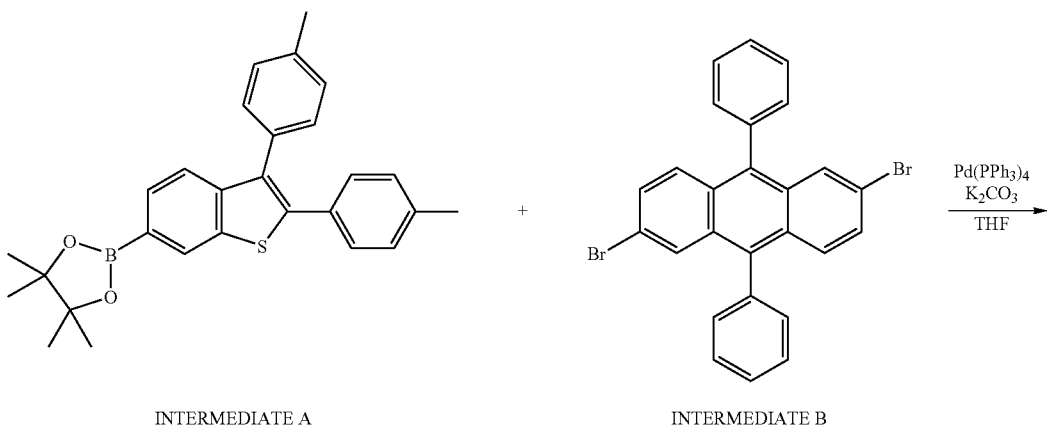

INTERMEDIATE A + INTERMEDIATE B

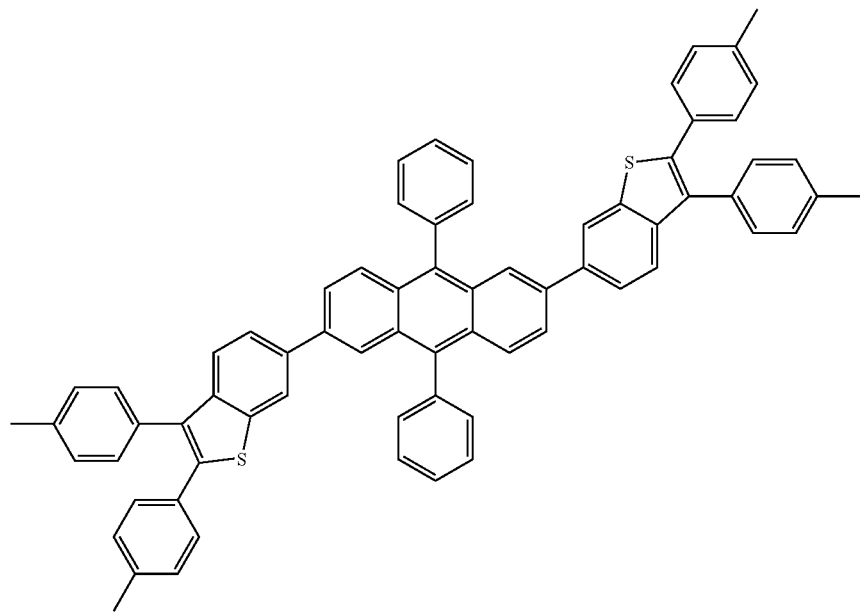

COMPOUND 2

Synthesis of Compound 2:

Under argon atmosphere, 1.8 g (3.7 mmol) of Intermediate B, 4.0 g (9.25 mmol) of Intermediate A, 0.86 g (8.14 mmol) of $K_2CO_3$, and 0.21 g (0.185 mmol) of Pd $(PPh_3)_4$ were added to THF and water in a 500 ml round-bottomed flask, and stirred at 85° C. for 12 hours. An organic layer was extracted with methylene chloride. The extracted organic layer was dried with magnesium sulfate, filtered and removed of solvent by evaporation. The obtained solid pre-product was refined through column chromatography (silica, hexane-diethyl ether), thereby resulting in 3.0 g of yellow solid of compound 2 with a yield of 86%.

$^1$H-NMR (CDCl$_3$, 300 MHz): 7.47-8.01 (m, 17H), 6.98-7.32 (m, 21H), 2.7-2.39 (d, 12H)

Synthesis Example 2

Synthesis of Compound 3

[Reaction Scheme 4]

[Reaction Scheme 5]

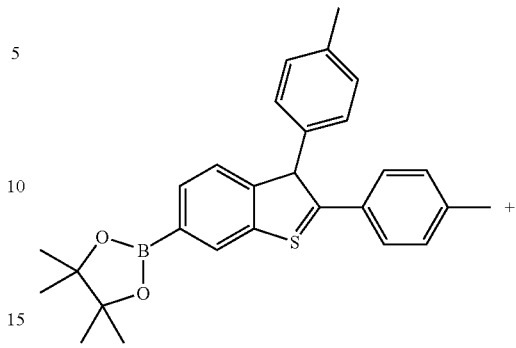

Preparation of (2-bromo-9,10-diphenyl-anthracene) (Intermediate C):

In a 500 ml round-bottomed flask, 3 g (9.5 mmol) of 9,10-diphenyl-anthracene and 8.2 g (46 mmol) of NBS were dissolved in 100 ml of DMF and stirred for 3 hours. The reaction was ended by adding 50 ml of water. An organic layer was extracted with brine and methylene chloride. The extracted organic layer was dried with anhydride magnesium sulfate, filtered and removed of solvent. The resulting solid pre-product was recrystallized in hexane. The crystals were dissolved in THF and refined through column chromatography (silica, hexane), thereby resulting in 1.4 g of yellow solid Intermediate C with a yield of 32%.

Synthesis of Compound 3:

1.8 g (3.8 mmol) of Intermediate C was dissolved in 100 ml of THF. 2.0 g (3.8 mmol) of Intermediate A, 0.21 g (0.185 mmol) of tetrakis (triphenylphosphine)palladium, and 8 mmol of $K_2CO_3$ were dissolved in 30 ml of toluene and 4 ml of water, which was added to the above THF solution of Intermediate C, and stirred at a refluxing temperature for 12 hours. The mixture was cooled to room temperature, and 100 ml of diethyl ether was added thereto. The resulting solution was twice cleansed with 100 ml of water. An organic layer was collected, and dried with anhydride magnesium sulfate. Solvent was evaporated to obtain a crude product. The crude Synthesis Example 3

Synthesis of Compound 4

[Reaction Scheme 6]

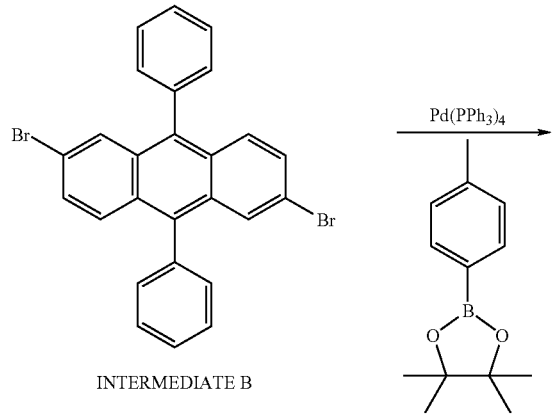

INTERMEDIATE B

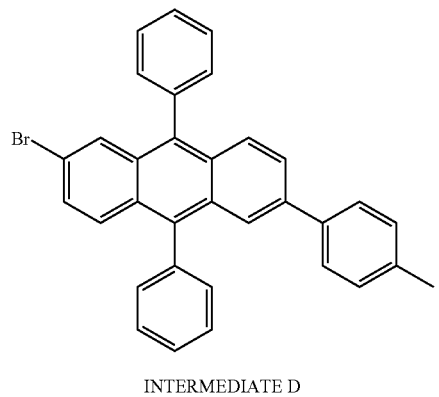

INTERMEDIATE D

Preparation of 2-bromo-9,10-diphenyl-6-p-tolyl-anthracene (Intermediate D):

Under argon atmosphere, 1.8 g (3.7 mmol) of Intermediate B, 0.5 g (3.7 mmol) of 4,4,5,5-tetramethyl-2-p-tolyl-[1,3,2]dioxaborolane, 0.86 g (8.14 mmol) of $K_2CO_3$, and 0.21 g (0.185 mmol) of Pd $(PPh_3)_4$ were added to THF and water in a 500 ml round-bottomed flask, and refluxed at 85° C. for 12 hours. An organic layer was extracted with methylene chloride, dried with $MgSO_4$, filtered, and removed of solvent. The resulting solid pre-product was refined through column chromatography (silica, hexane-diethyl ether), thereby resulting in 3.0 g of yellow solid Intermediate D with a yield of 86%.

Synthesis of Compound 4:

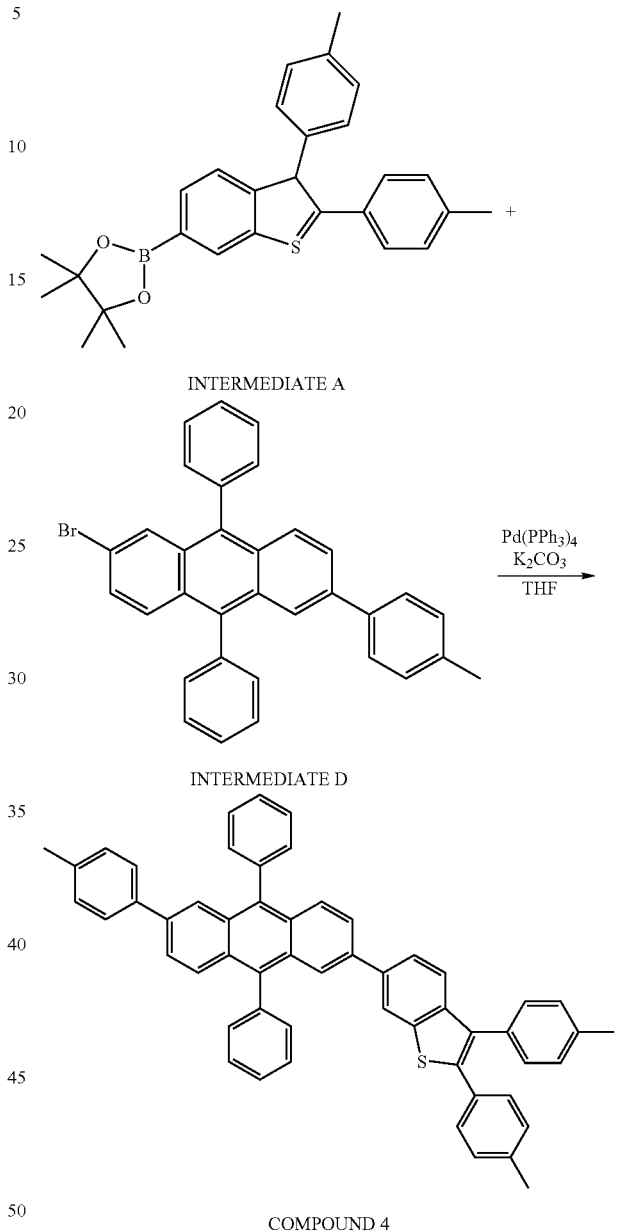

1.89 g (3.8 mmol) of Intermediate D was dissolved in THF. 2.0 g (3.8 mmol) of Intermediate A, 0.21 mg (0.185 mmol) of tetrakis (triphenylphosphine)palladium, and 8 mmol of $K_2CO_3$ were dissolved in toluene and water, then added to the above THF solution of Intermediate A, and stirred at a refluxing temperature for 12 hours. The mixture was cooled to room temperature and 100 ml of diethyl ether was added thereto. The resulting solution was cleansed twice with 100 ml of water and an organic layer was collected. The collected organic layer was dried with anhydride magnesium sulfate, and solvent was evaporated to produce a crude product. The crude product was refined through silica gel column chromatography and recrystallized to produce 2.9 mg of Compound 4 with a yield of 83%.

Synthesis Example 4

Synthesis of Compound 5

Intermediate E (6-4,4,5,5-tetramethyl-[1,3,2]dioxaborolane-2-yl)-2,3-di-p-tolyl-benzofuran) was produced through Reaction Scheme 8 using the synthesis method of Example 1 except that 2,3-Dibromo-benzofuran was used instead of 2,3-dibromo-benzo[b]thiophene as a starting material of Synthesis Example 1. Compound 5 was produced through Reaction Scheme 9.

[Reaction Scheme 8]

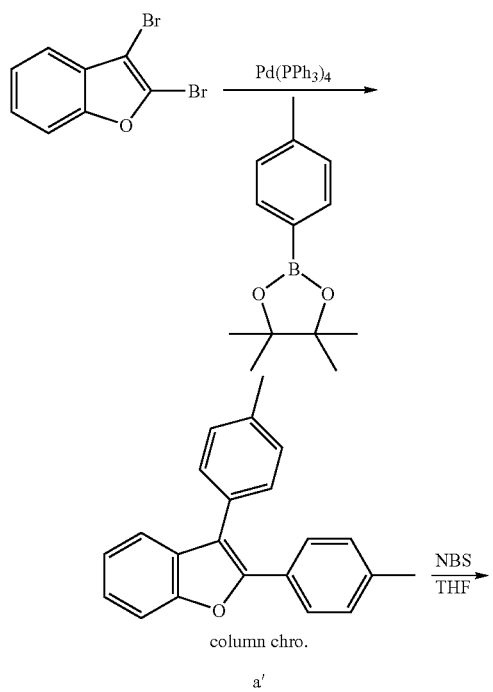

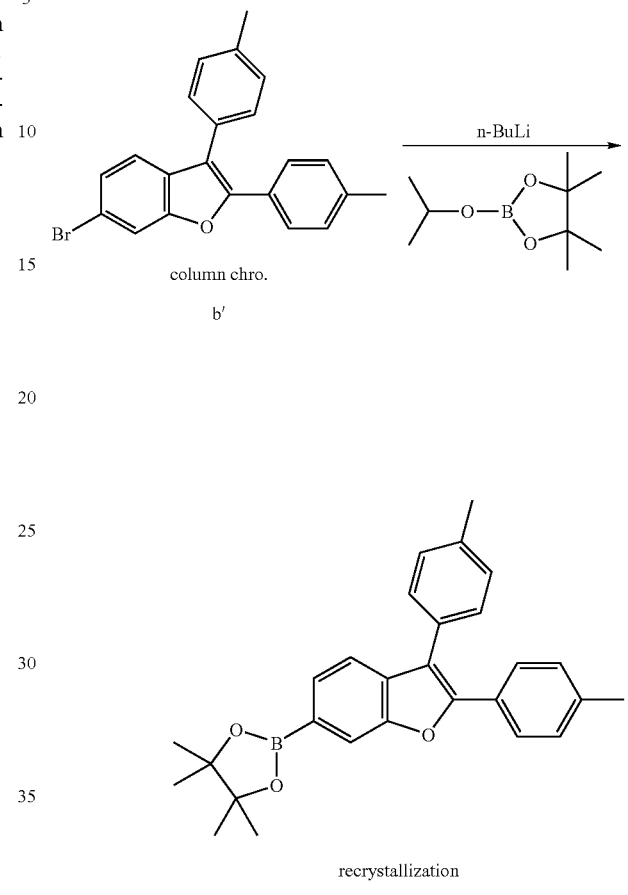

[Reaction Scheme 9]

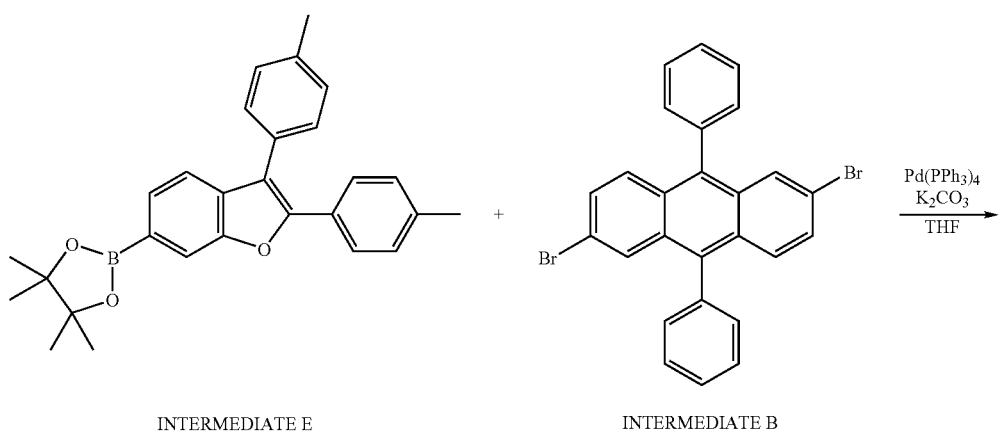

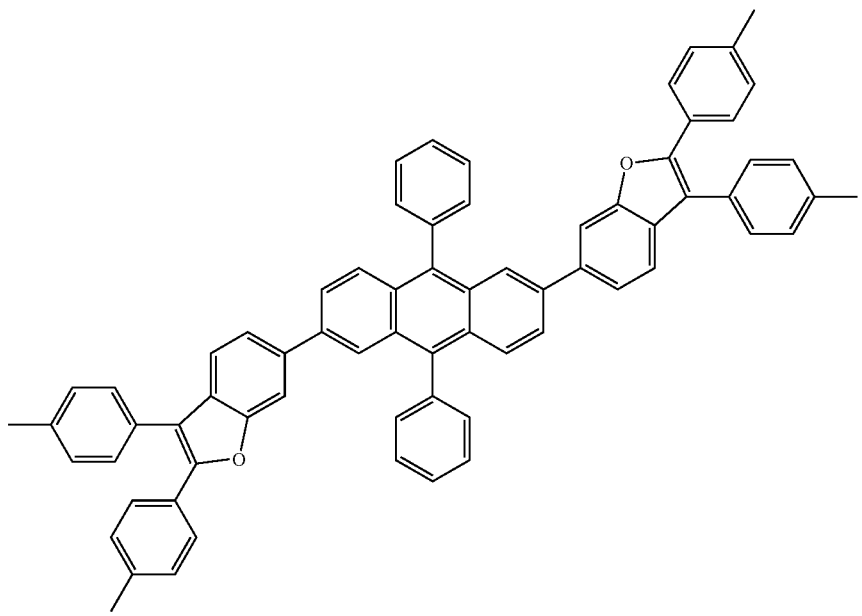
COMPOUND 5
Synthesis Example 5
Synthesis of Compound 6
Intermediate E which was synthesized through Reaction Scheme 8 was reacted with Intermediate D through Reaction Scheme 10, thereby resulting in Compound 6. The synthesis method of Example 3 was used.
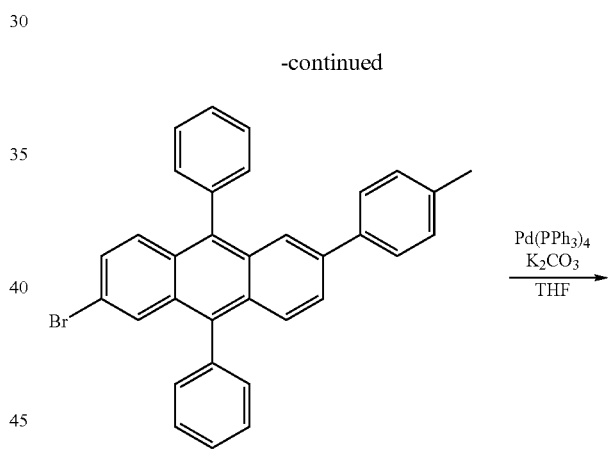
INTERMEDIATE D
[Reaction Scheme 10]
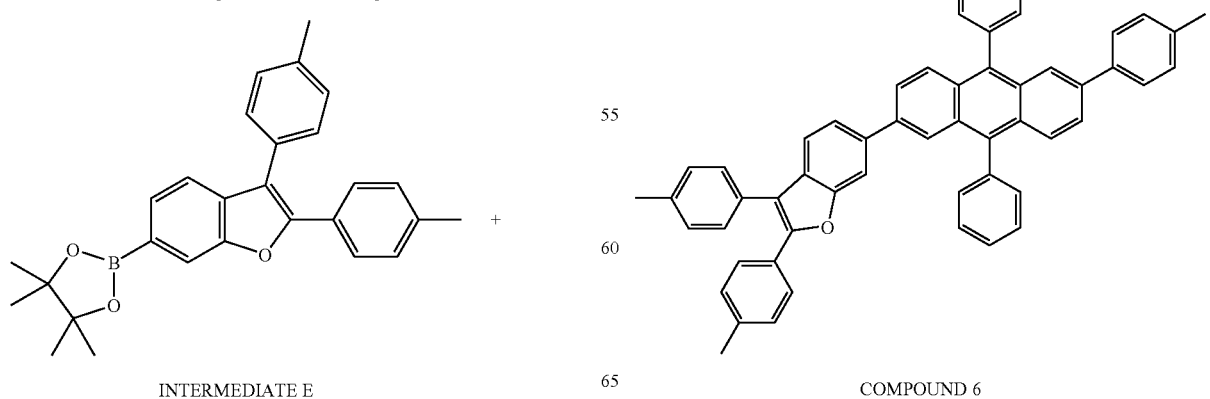
INTERMEDIATE E + COMPOUND 6

Synthesis Example 6

Synthesis of Compound 7

Intermediate F (1-methyl-6-(4,4,5,5-tetramethyl-[1,3,2]dioxaborolan-2-yl)-2,3-di-p-tolyl-1H-indole) was produced through Reaction Scheme 11 below, then Compound 7 was synthesized through Reaction Scheme 12 using the synthesis method of Example 1 except using 2,3-dibromo-1-methyl-1H-indole instead of 2,3-dibromo-benzo[b]thiophene as a starting material.

[Reaction Scheme 11]

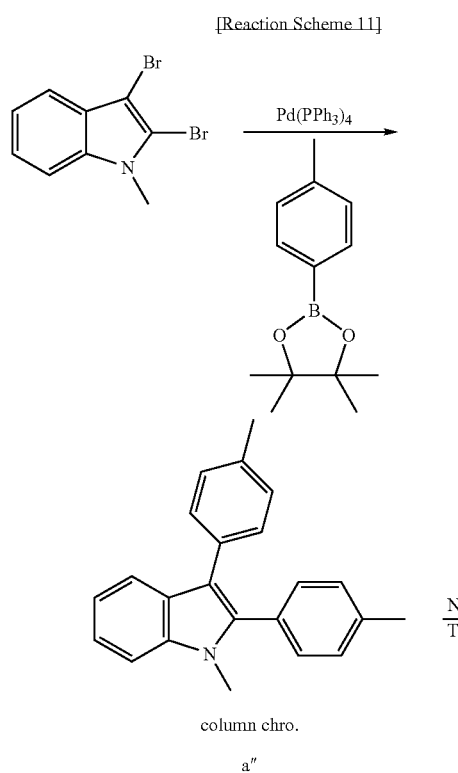

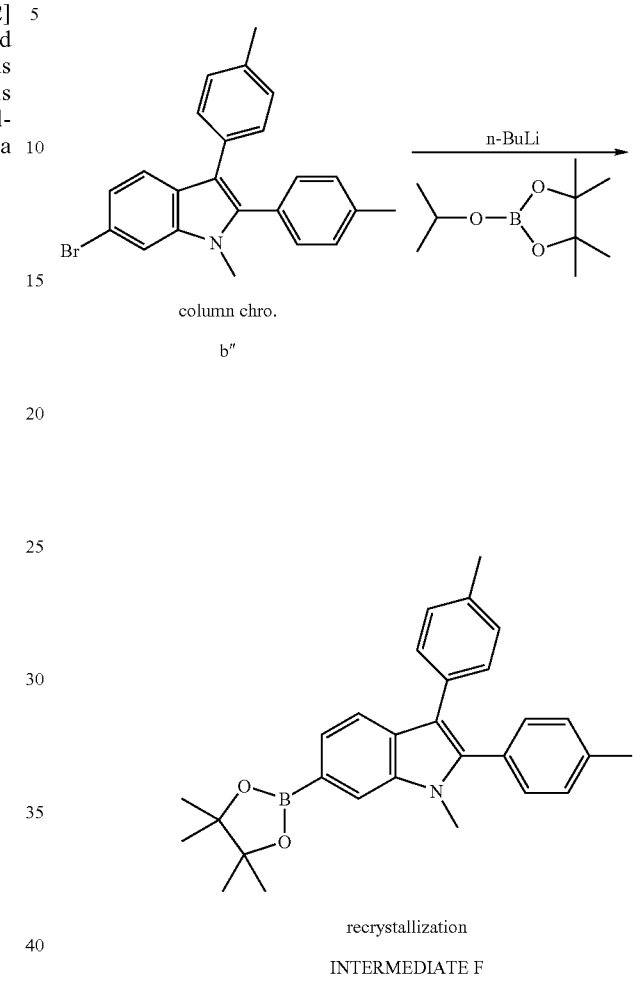

[Reaction Scheme 12]

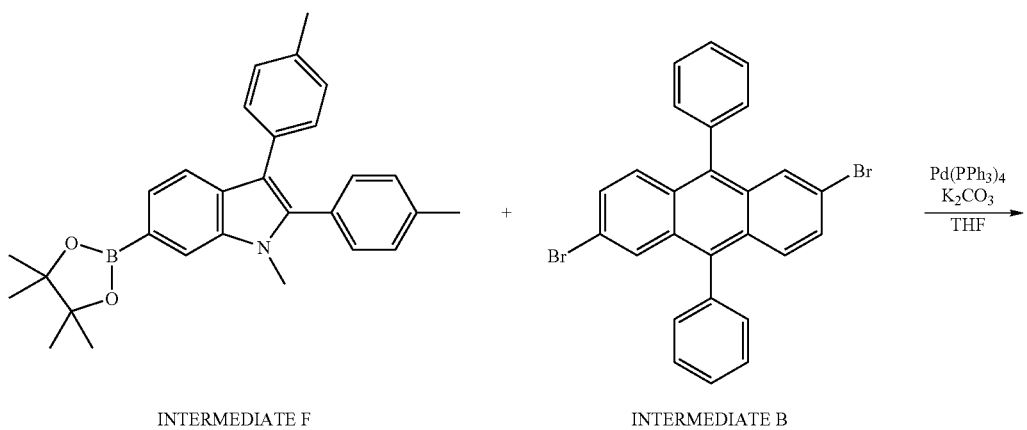

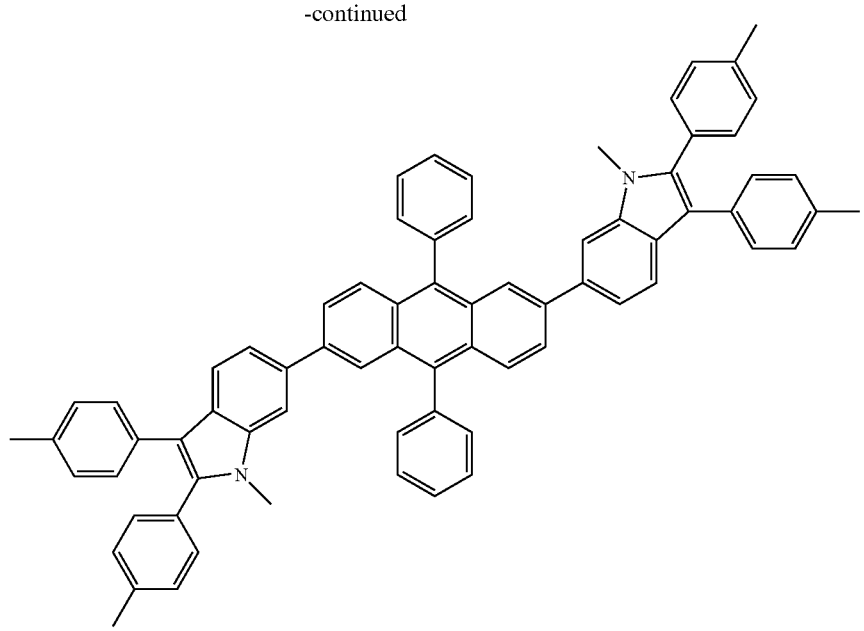

COMPOUND 7

Synthesis Example 7

Synthesis of Compound 8

Intermediate F synthesized through Reaction Scheme 11 was reacted with Intermediate D through Reaction Scheme 13 to produce Compound 8. The synthesis method of Example 3 was used.

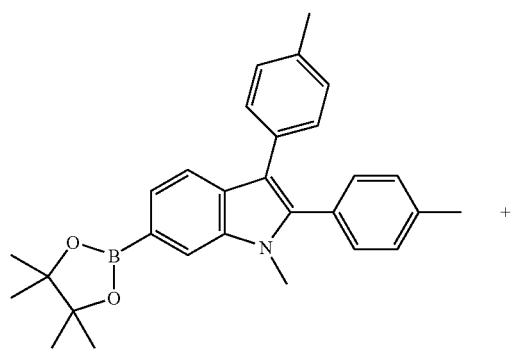

INTERMEDIATE F

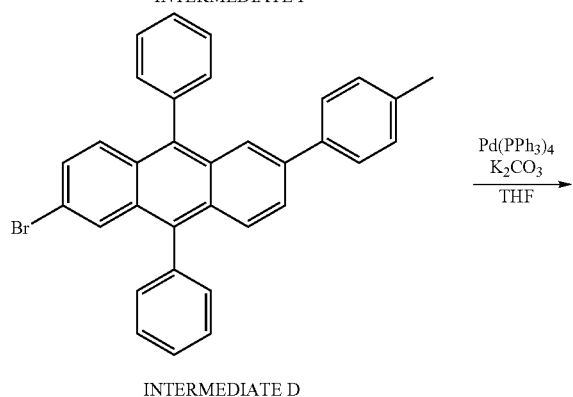

INTERMEDIATE D

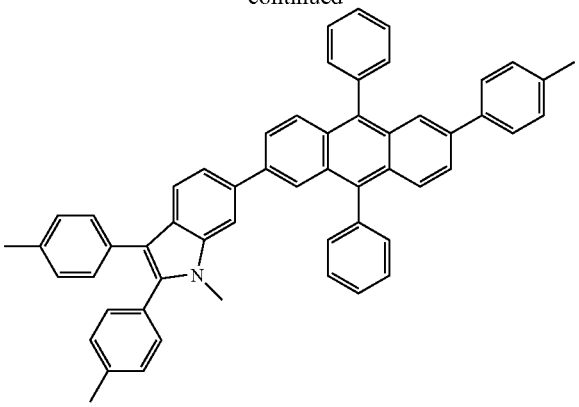

COMPOUND 8

Evaluation 1—Measurement of thermostability of Compounds 2-6

Since the glass transition temperature ($T_g$) and the melting point ($T_m$) of each compound could not be measured, the thermostability of Compounds 2 through 6 was evaluated by measuring the thermal decomposition temperature ($T_d$). $T_d$ was measured by increasing the temperature from room temperature to 800° C. at the rate of 10° C./min, using a thermo gravimetric analysis (TGA). The $T_d$ results are shown in Table 1.

TABLE 1

| Compound No. | $T_d$ (° C.) |
|---|---|
| Compound 2 | 489.4 |
| Compound 3 | 409.3 |
| Compound 4 | 415.2 |
| Compound 5 | 490.0 |
| Compound 6 | 415.5 |

Referring to Table 1, the Compounds 2-6 have thermostability and are suitable for organic EL devices.

Evaluation 2: Measurement of Light-Emitting Properties

The light-emitting property of each compound was evaluated by measuring the UV Absorption Spectrum and photoluminescence (PL) Spectrum of each compound. First, the compound 2 was diluted in toluene to a concentration of 0.2 mM and its UV Absorption Spectrum was measured using Shimadzu UV-350 Spectrometer. The UV Absorption Spectra of Compounds 3 and 4 were also measured using the process of synthesizing Compound 2. Compounds 2 through 4 were diluted in toluene to a concentration of 10 mM, and their PL Spectra was measured by using an ISC PC1 Spectrofluorometer equipped with a Xenon Lamp. The UV Absorption Spectra and PL Spectra results are shown in Table 2.

TABLE 2

| Compound No. | Maximum Absorption Wavelength (nm) | Maximum PL Wavelength (nm) |
|---|---|---|
| Compound 2 | 345 | 451 |
| Compound 3 | 344 | 448 |
| Compound 4 | 344 | 448 |

Referring to Table 2, Compounds 2-4 have light-emitting properties suitable for organic EL devices.

Hereinafter, the present invention will be described more specifically with reference to the following examples. However, these examples are provided for illustrative purposes only and are not intended to limit the scope of the invention.

Example 1

An organic EL device having an ITO/PEDOT (500 Å)/compound 2_host TBADN (480 Å)/Alq3 (200 Å)/LiF (10 Å)/and Al (2,000 Å) structure was manufactured using the compound represented by Formula 30 (TBADN) as a host for an emissive layer and the compound 2 as a dopant for an emissive layer An anode was prepared by cutting a 15 Ω/cm² (1,000 Å) ITO glass substrate to the size of 50 mm×50 mm×0.7 mm, microwave-washing the substrate in acetone isopropyl alcohol and pure water respectively for 15 minutes, and UV ozone washing the substrate for 30 minutes. PEDOT-PSS (Al4083) of Bayer Corporation was coated on the substrate. Then the substrate was heat-treated at 110° C. for 5 minutes under air and heat-treated at 200° C. for 5 minutes under nitrogen to form a 500 Å hole injection layer. The combination of 0.1 g of the host Compound 30 (TBADN) and 0.05 g of the dopant Compound 2 (The amount of the compound 2 was 5 parts by weight per 100 parts by weight of the Compound 30) was spin-coated on the hole injection layer, and heat-treated at 100° C. for 30 minutes to form a 480 Å-thick emissive layer. Then, Alq₃ compound was vacuum-deposited on the emissive layer to a thickness of 200 Å to form an electron transport layer. 10 Å of LiF (an electron injection layer) and 2,000 Å of Al (cathode) were sequentially vacuum-deposited on the electron transport layer to produce an organic EL device as illustrated in FIG. 1A. The organic EL device will be referred to as Sample 1.

Example 2

An organic EL device having an ITO/PEDOT (500 Å)/compound 3_host TBADN (480 Å)/Alq3 (200 Å)/LiF (10 Å)/Al (2,000 Å) structure was manufactured using the process of Example 1 except that a compound represented by Formula 3 instead of compound 2 was used as a dopant for an emissive layer. The resulting organic EL device will be referred to as Sample 2.

Comparative Example 1

An organic EL device having an ITO/PEDOT (500 Å)/compound 3_host TBADN (480 Å)/Alq3 (200 Å)/LiF (10 Å)/Al (2,000 Å) structure was manufactured using the process of Example 1 except that a compound represented by Formula 31 instead of compound 30 was used as a host for an emissive layer. The resulting organic EL device will be referred to as Sample 3.

<Formula 31>

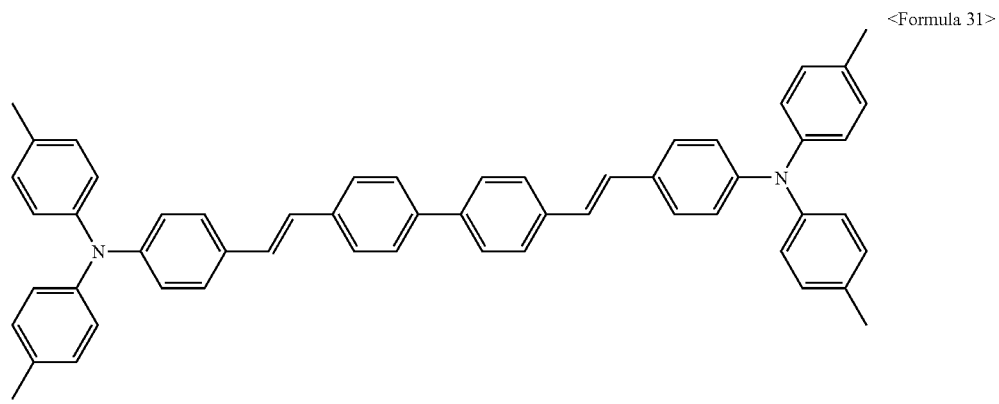

Evaluation 4: Property Evaluation of Samples 1, 2 and 3

Driving voltage, color purity, and efficiency of Samples 1, 2 and 3, were measured using a PR650 (Spectroscan) Source Measurement Unit. The results are shown in Table 4.

TABLE 4

| Sample No. | Turn on Voltage (V) | CIE color coordinate (~100 cd/m²) | efficiency (cd/A) |
|---|---|---|---|
| 1 | 3.0 | (0.15, 0.16) | 4.5 through 7.02 |
| 2 | 2.8 | (0.15, 0.15) | 4.0 through 6.45 |
| 3 | 3.4 | (0.16, 0.27) | 5.4 through 6.16 |

Table 4 shows that Samples 1 and 2 have superior electric properties.

FIG. 2 is a graph showing absorption spectra and PL Spectra of films of Example 1 and Comparative Example 1 according to embodiments of the present invention. Referring to FIG. 2, Compound 2 improved color purity by increasing the absorption wavelength compared to using only TBADN as a dopant.

While this invention has been particularly shown and described with reference to embodiments thereof, it will be understood by those skilled in the art that various changes in form and details may be made therein without departing from the spirit and scope of the invention as defined by the appended claims.

What is claimed is:

1. An organic light-emitting compound represented by Formula 1:

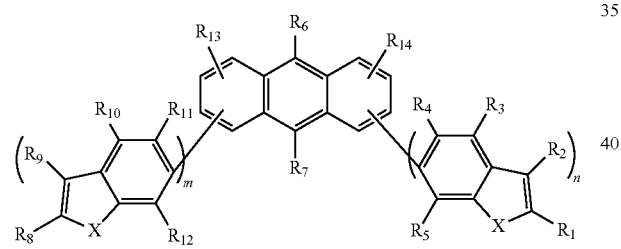

(1)

where $R_1, R_2, R_3, R_4, R_5, R_6, R_7, R_8, R_9, R_{10}, R_{11}, R_{12}, R_{13}$ and $R_{14}$ are each independently selected from the group consisting of hydrogen, halogen, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group or —N $(Z_1)(Z_2)$ or —Si $(Z_3)(Z_4)(Z_5)$, wherein $Z_1, Z_2, Z_3, Z_4$ and $Z_5$ are each independently selected from the group consisting of hydrogen, a substituted or unsubstituted $C_1$-$C_{50}$ alkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group, a substituted or unsubstituted $C_5$-$C_{50}$ cycloalkyl group, or a substituted or unsubstituted $C_5$-$C_{50}$ heterocycloalkyl group;

X is $C(Z_6)(Z_7)$, $N(Z_8)$, O, S, $SO_2$, Se, or $SeO_2$, wherein $Z_6$, $Z_7$ and $Z_8$ are each independently selected from the group consisting of hydrogen, a substituted or unsubstituted $C_1$-$C_{50}$ alkyl group, or a $C_6$-$C_{50}$ aryl group; and m and n are each independently 0, 1 or 2, but not concurrently 0, wherein the organic light-emitting compound further represented by one of Formulae 2 through 7 and 9 through 29:

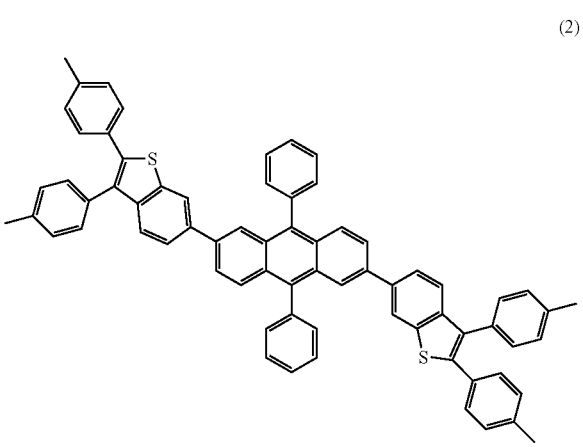

(2)

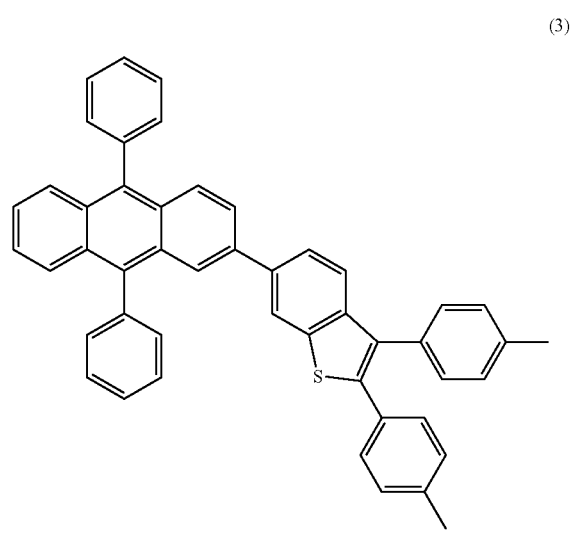

(3)

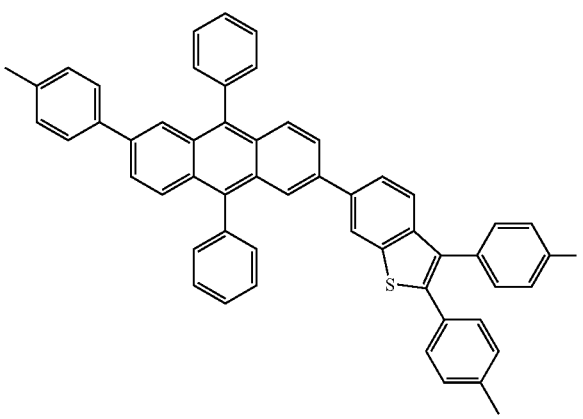

(4)

(5)
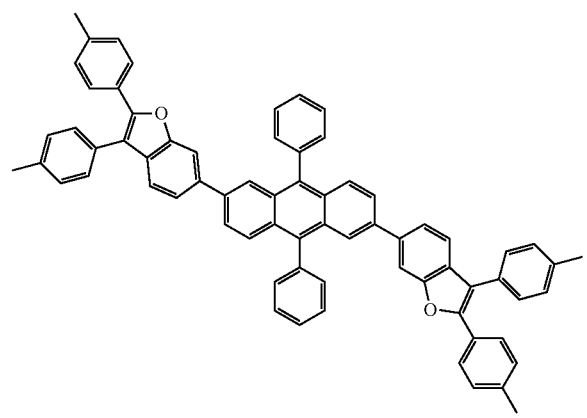
(10)
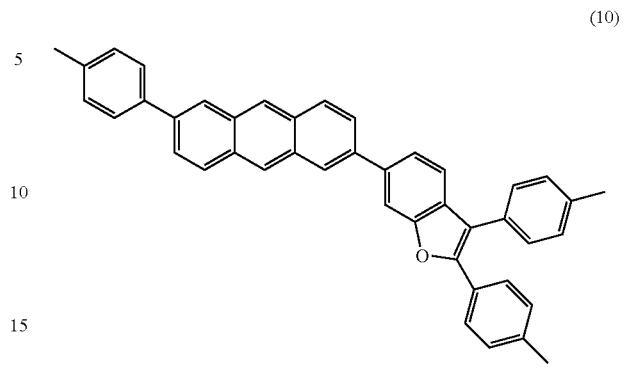
(6)
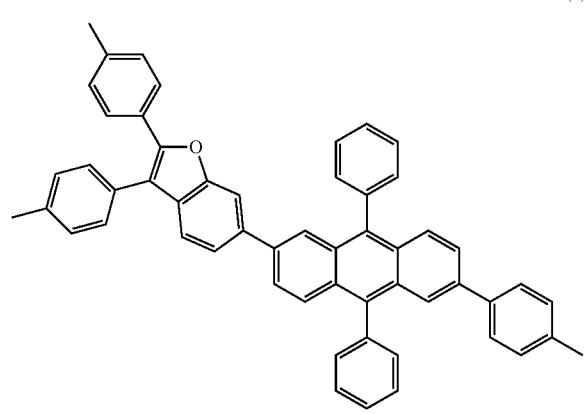
(11)
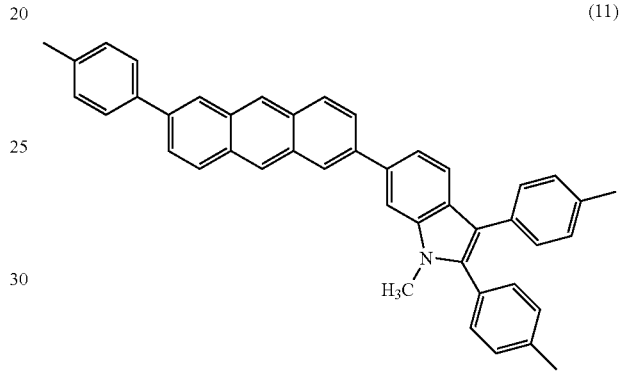
(7)
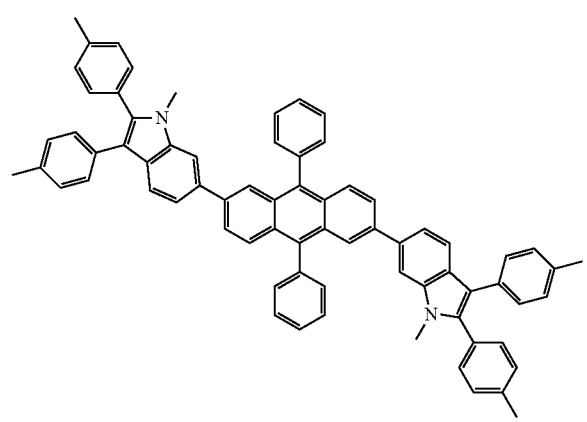
(12)
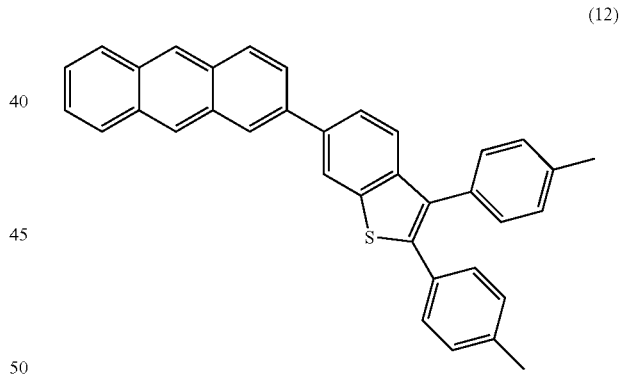
(9)
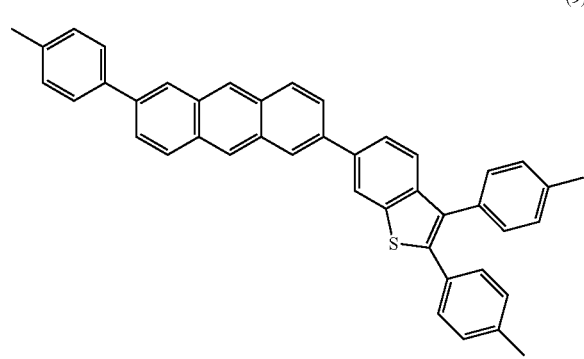
(13)
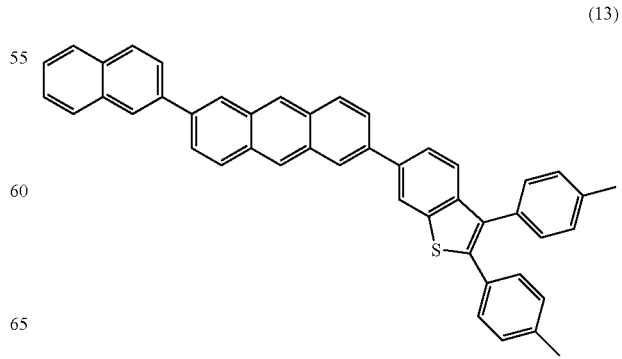

(14)
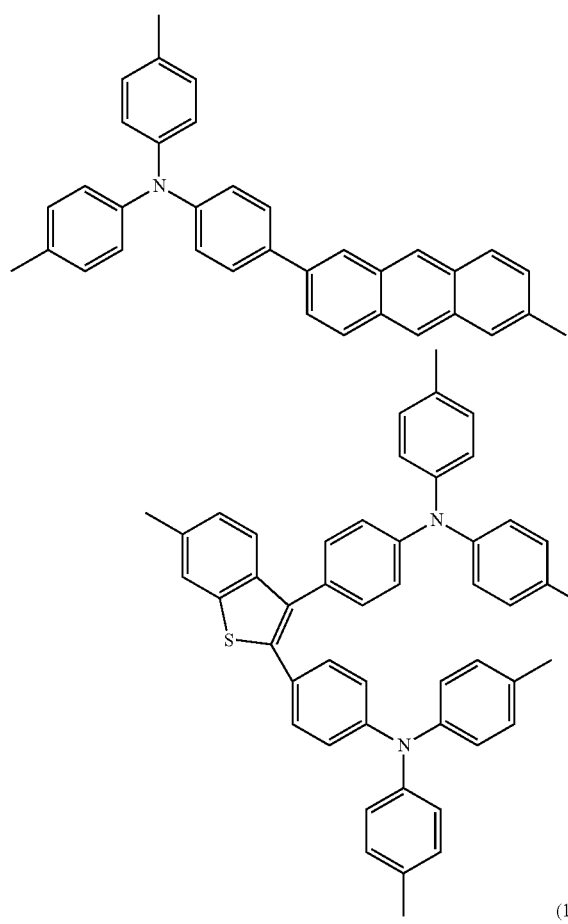
(15)
(16)
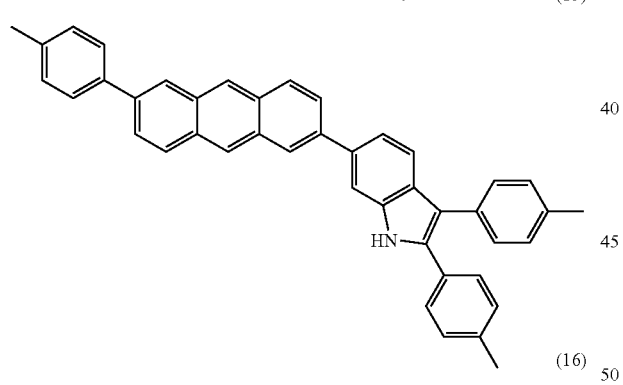
(17)
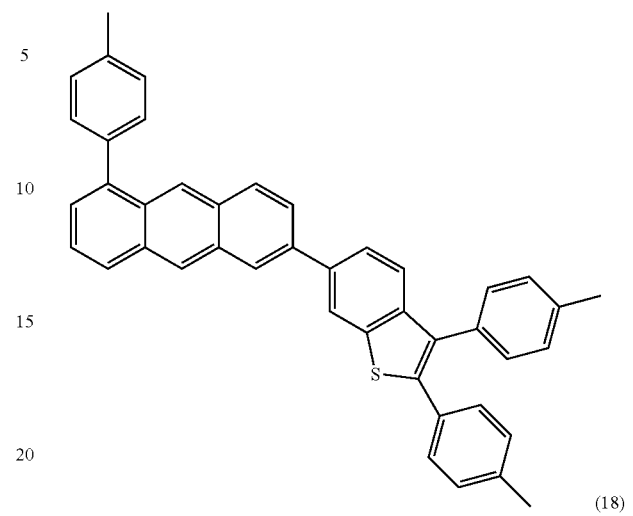
(18)
(19)
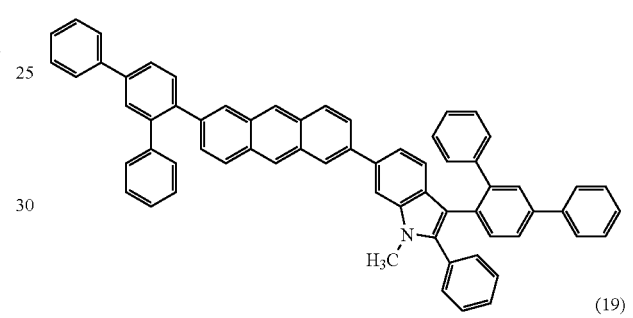
(20)
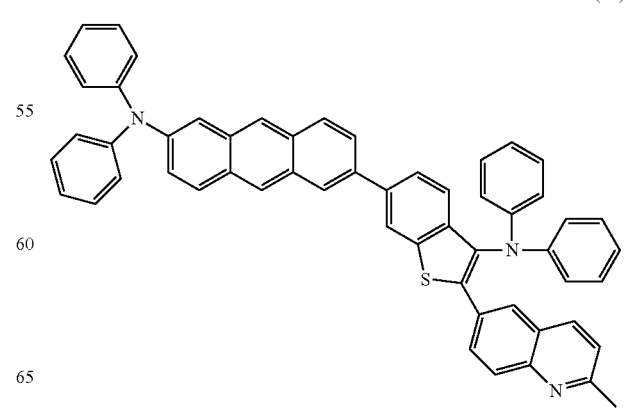

(21)
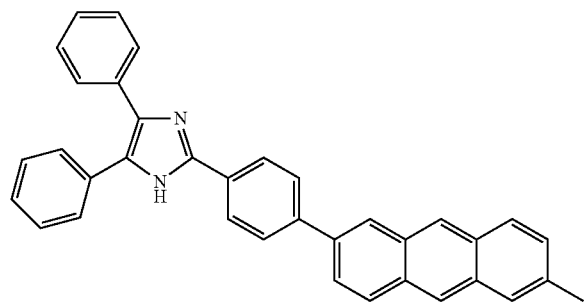
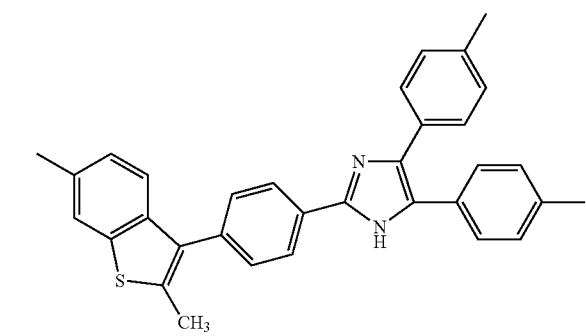
(22)
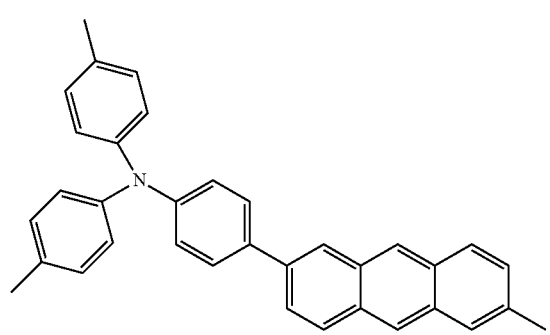
(23)
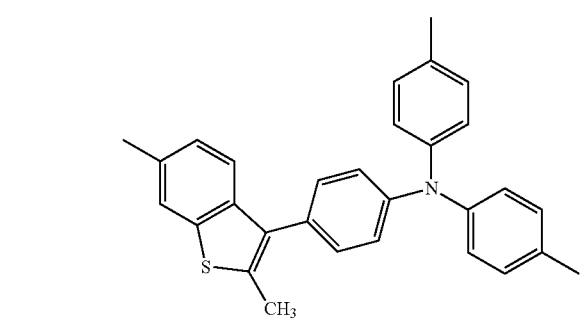
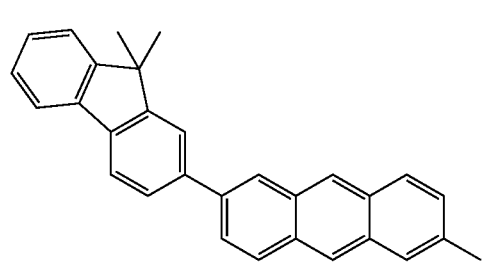
(24)
(25)
(26)
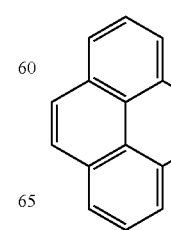

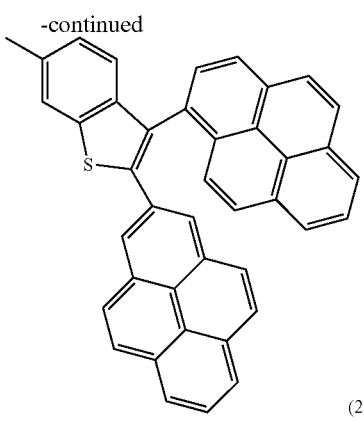

(27)

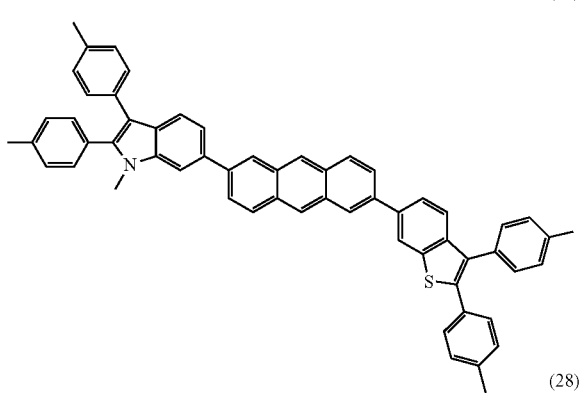

(28)

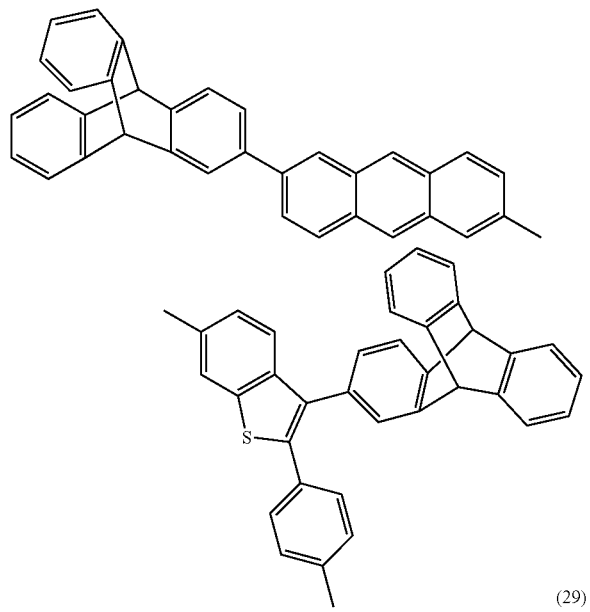

(29)

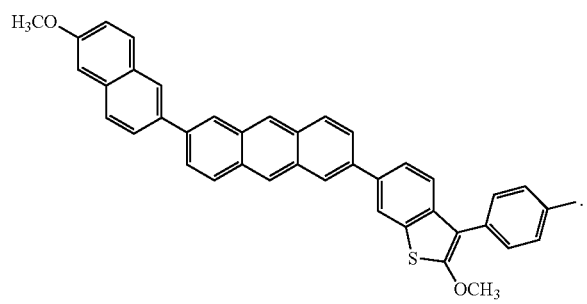

2. The organic light-emitting compound of claim 1, wherein substituent groups of the substituted alkyl group, the substituted alkoxy group, the substituted aryl group, the substituted heteroaryl group, the substituted cycloalkyl group and the substituted heterocycloalkyl group are selected from the group consisting of —F; —Cl; —Br; —CN; —NO$_2$; —OH; a $C_1$-$C_{50}$ alkyl group which is unsubstituted or substituted with —F, —Cl, —Br, —CN, —NO$_2$ or —OH; a $C_1$-$C_{50}$ alkoxy group which is unsubstituted or substituted with —F, —Cl, —Br, —CN, —NO$_2$ or —OH; a $C_6$-$C_{50}$ aryl group which is unsubstituted or substituted with a $C_1$-$C_{50}$ alkyl group, a $C_1$-$C_{50}$ alkoxy group, —F, —Cl, —Br, —CN, —NO$_2$ or —OH; a $C_2$-$C_{50}$ heteroaryl group which is unsubstituted or substituted with a $C_1$-$C_{50}$ alkyl group, a $C_1$-$C_{50}$ alkoxy group, —F, —Cl, —Br, —CN, —NO$_2$ or —OH; a $C_5$-$C_{50}$ cycloalkyl group which is unsubstituted or substituted with a $C_1$-$C_{50}$ alkyl group, a $C_1$-$C_{50}$ alkoxy group, —F, —Cl, —Br, —CN, —NO$_2$ or —OH; a $C_5$-$C_{50}$ heterocycloalkyl group which is unsubstituted or substituted with a $C_1$-$C_{50}$ alkyl group, a $C_1$-$C_{50}$ alkoxy group, —F, —Cl, —Br, —CN, —NO$_2$ or —OH; and a group which is represented as —N($Z_9$)($Z_{10}$), where $Z_9$ and $Z_{10}$ are each independently selected from the group consisting of hydrogen; a $C_1$-$C_{50}$ alkyl group; or a $C_6$-$C_{50}$ aryl group which is substituted with a $C_1$-$C_{50}$ alkyl group.

3. The organic light-emitting compound of claim 1, wherein $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ are each independently selected from the group consisting of hydrogen, a $C_1$-$C_{50}$ alkyl group, a $C_1$-$C_{50}$ alkoxy group, a phenyl group, a biphenyl group, a pentalenyl group, a indenyl group, a naphthyl group, a biphenylenyl group, an anthracenyl group, an azulenyl group, a heptalenyl group, an acenaphthallenyl group, a phenalenyl group, a fluorenyl group, a methylanthryl group, a phenanthrenyl group, a triphenylenyl group, a pyrenyl group, a chrysenyl group, an ethylchrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a fluorenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, an oxiranyl group, a pyrrolidinyl group, a pyrazolidinyl group, an imidazolidinyl group, a piperidinyl group, a piperazinyl group, a morpholinyl group, a di($C_6$-$C_{50}$ aryl)amino group, a tri($C_6$-$C_{50}$ aryl)silyl group and derivatives thereof.

4. The organic light-emitting compound of claim 3, wherein said derivatives thereof include at least one substituent selected from the group consisting of a methyl group, a methoxy group, a phenyl group, a tolyl group, a naphthyl group, a pyrenyl group, a phenanthrenyl group, a fluorenyl group, an imidazolinyl group, an indolyl group, a quinolinyl group, a diphenylamino group, a 2,3-di-p-tolylaminophenyl group, a triphenylsilyl group and derivatives thereof.

5. The organic light-emitting compound of claim 1, wherein X is $C(Z_6)(Z_7)$, $N(Z_8)$, O, S, $SO_2$, Se, or $SeO_2$, wherein $Z_6$, $Z_7$ and $Z_8$ are each independently hydrogen, a substituted or unsubstituted $C_1$-$C_{50}$ alkyl group or a $C_6$-$C_{50}$ aryl group.

6. The organic light-emitting compound of claim 1, wherein X is $CH_2$, $C(CH_3)_2$, $C(C_6H_5)_2$, NH, N—$CH_3$, N—$C_6H_5$, O, $SO_2$ or S.

7. An organic electroluminescent (EL) device, comprising:
a first electrode;
a second electrode; and
at least one organic layer between the first electrode and the second electrode, the organic layer comprising an organic light-emitting compound represented by Formula 1:

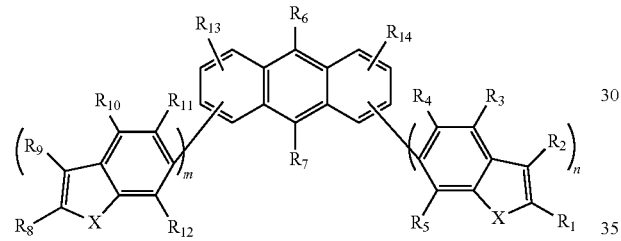

(1)

where $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ are each independently selected from the group consisting of hydrogen, halogen, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group or —N $(Z_1)(Z_2)$ or —Si $(Z_3)(Z_4)(Z_5)$, wherein $Z_1$, $Z_2$, $Z_3$, $Z_4$ and $Z_5$ are each independently selected from the group consisting of hydrogen, a substituted or unsubstituted $C_1$-$C_{50}$ alkyl group, a substituted or unsubstituted $C_6$-$C_{50}$ aryl group on the condition that each of $R_1$ and $R_8$ is not an anthracene group, a substituted or unsubstituted $C_2$-$C_{50}$ heteroaryl group, a substituted or unsubstituted $C_5$-$C_{50}$ cycloalkyl group, or a substituted or unsubstituted $C_5$-$C_{50}$ heterocycloalkyl group;

x is $C(Z_6)(Z_7)$, $N(Z_8)$, O, S, $SO_2$, Se, or $SeO_2$, wherein $Z_6$, $Z_7$ and $Z_8$ are each independently selected from the group consisting of hydrogen, a substituted or unsubstituted $C_1$-C50 alkyl group, or a $C_6$-$C_{50}$ aryl group; and m and n are each independently 0, 1 or 2, but not concurrently 0, wherein the organic light-emitting compound further represented by one of Formulae 2 through 7 and 9 through 29:

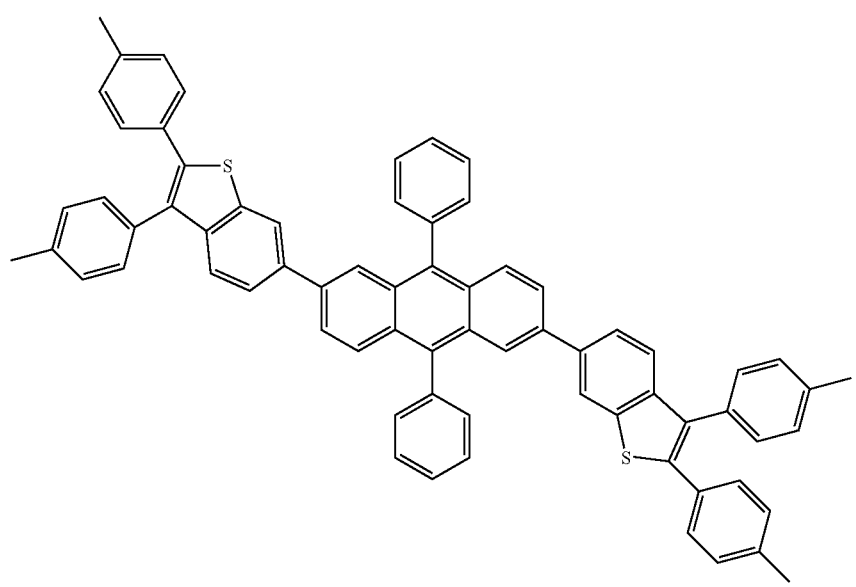

(2)

(3)
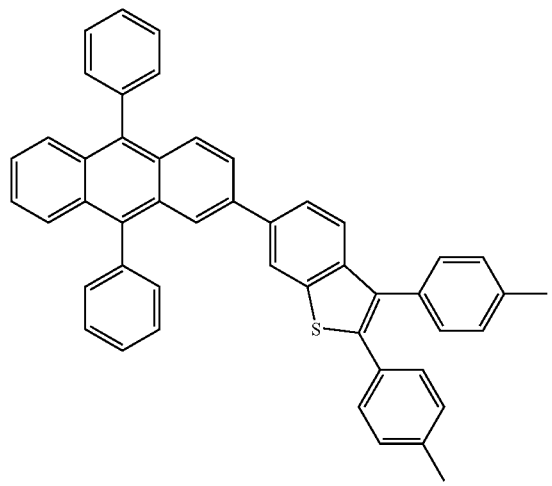
(4)
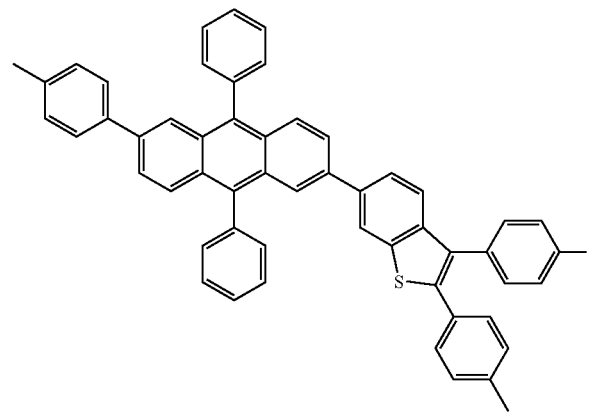
(5)
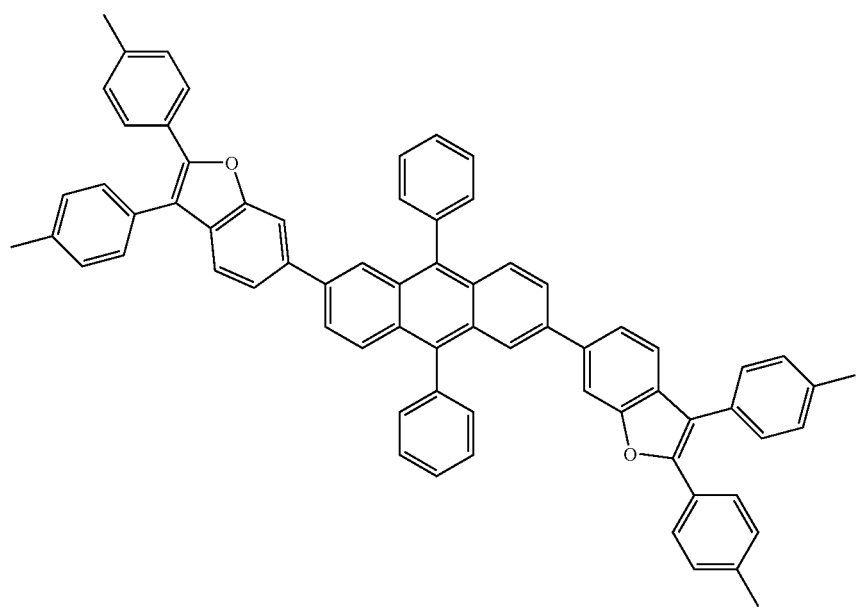
(6)
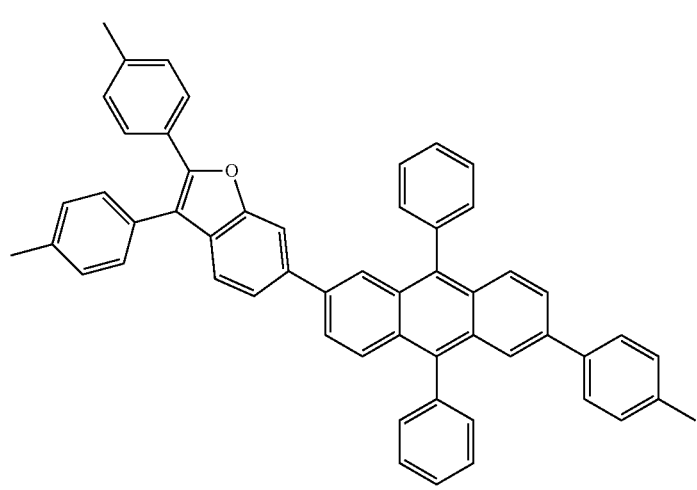

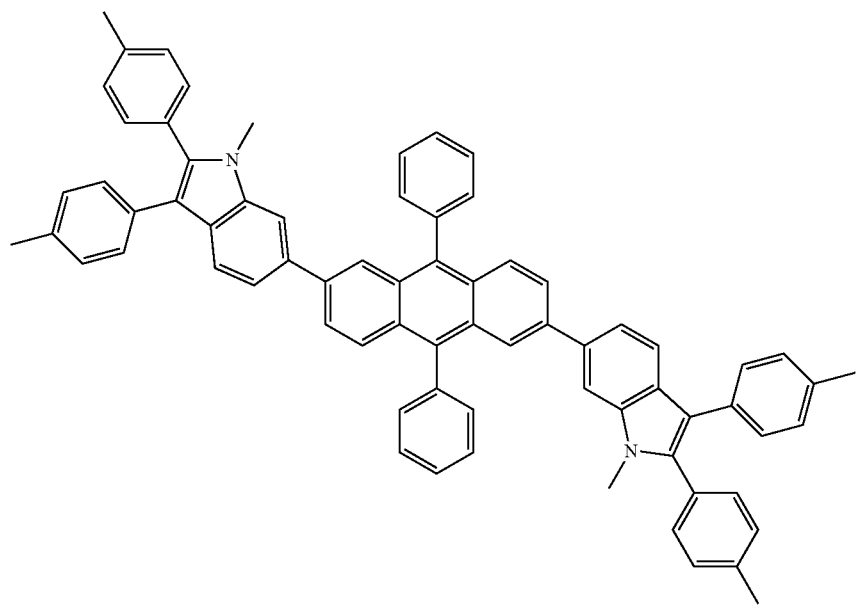
(7)
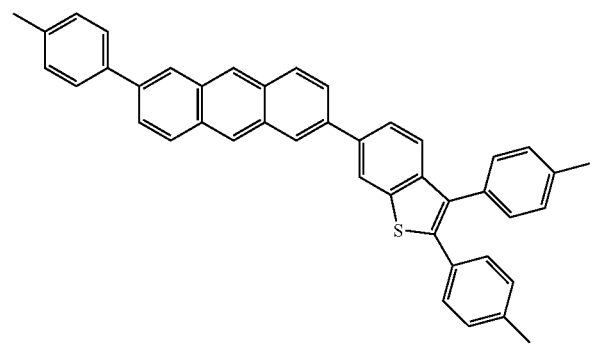
(9)
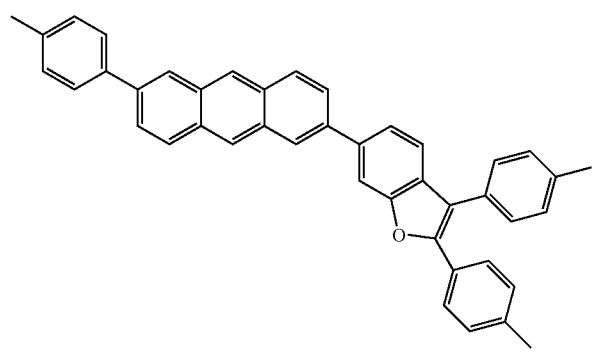
(10)
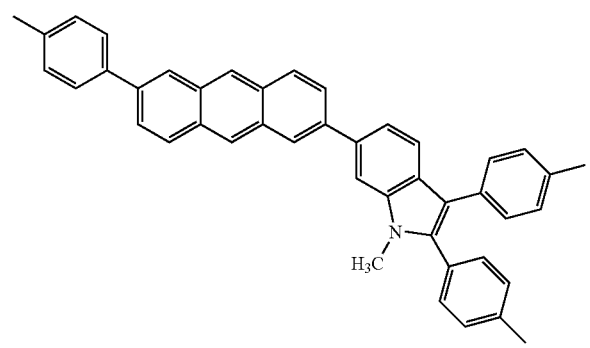
(11)

(12)
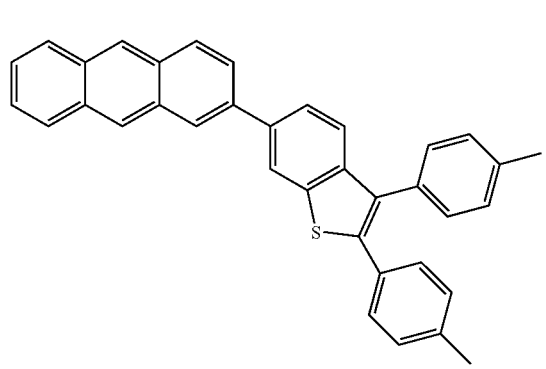
(13)
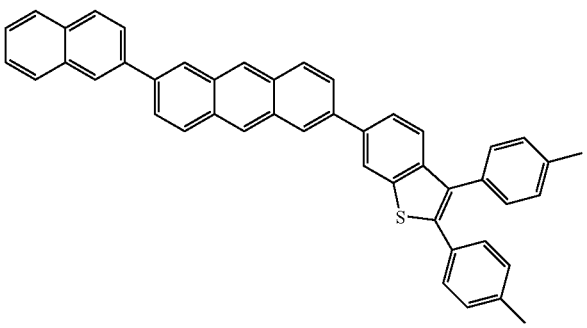
(14)
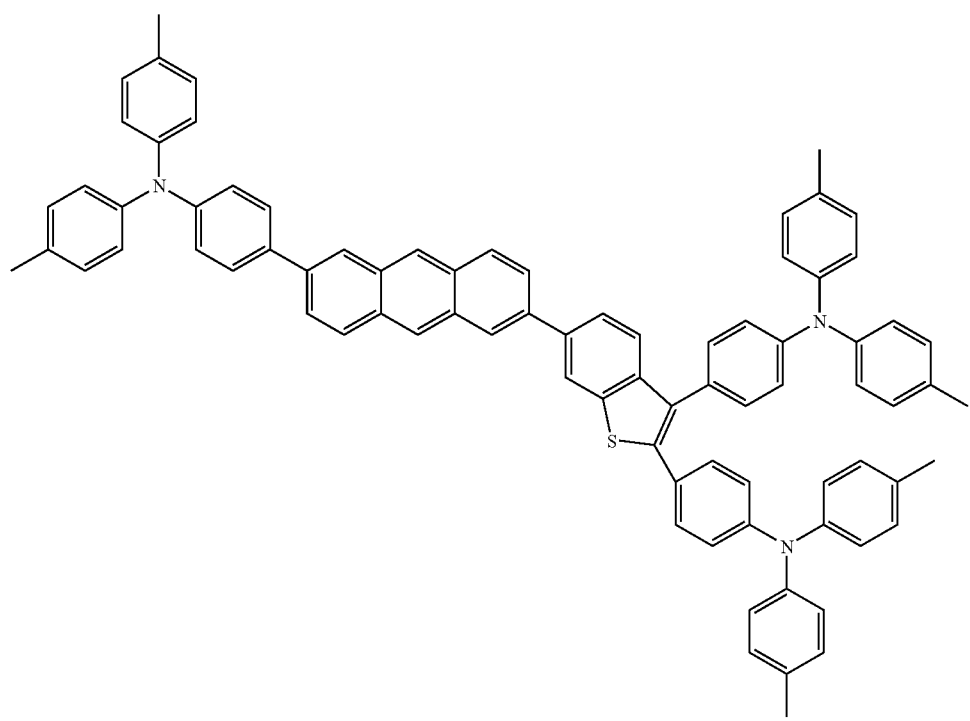
(15)
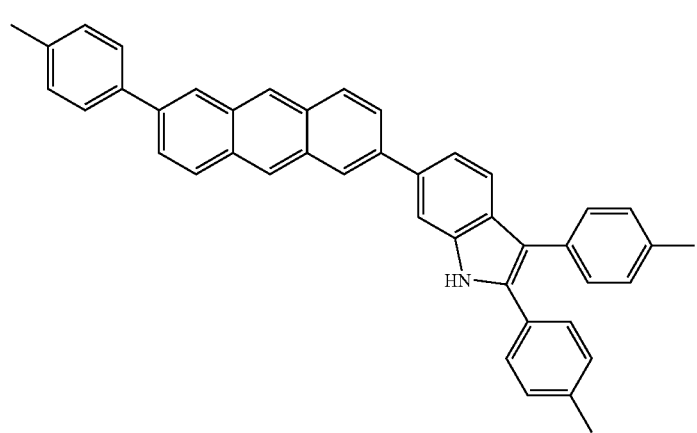

(16)
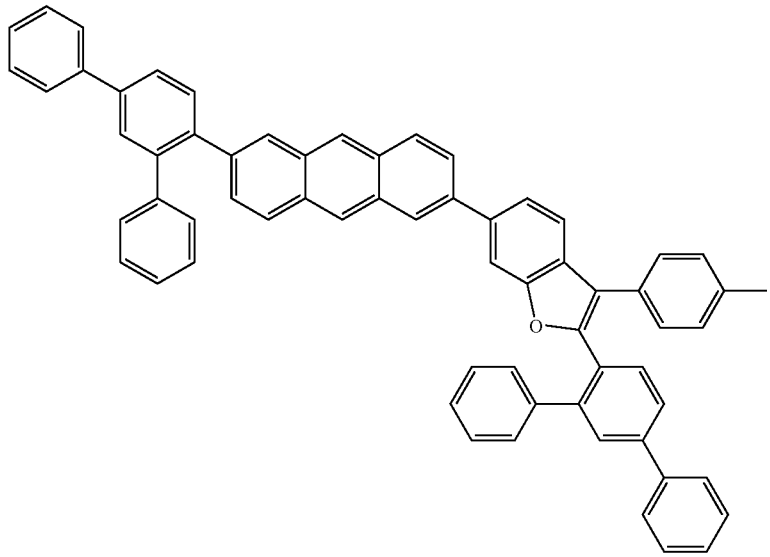
(17)
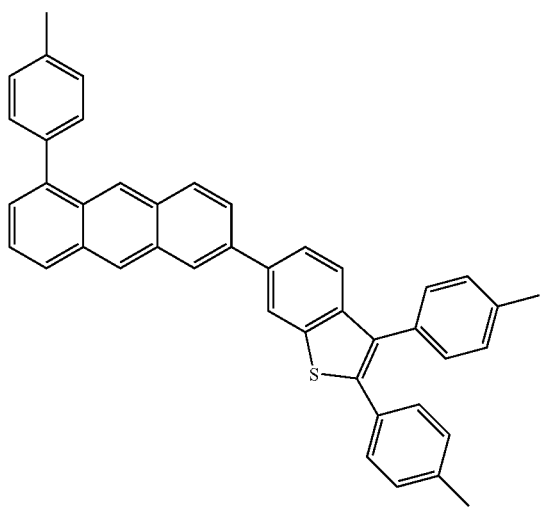
(18)
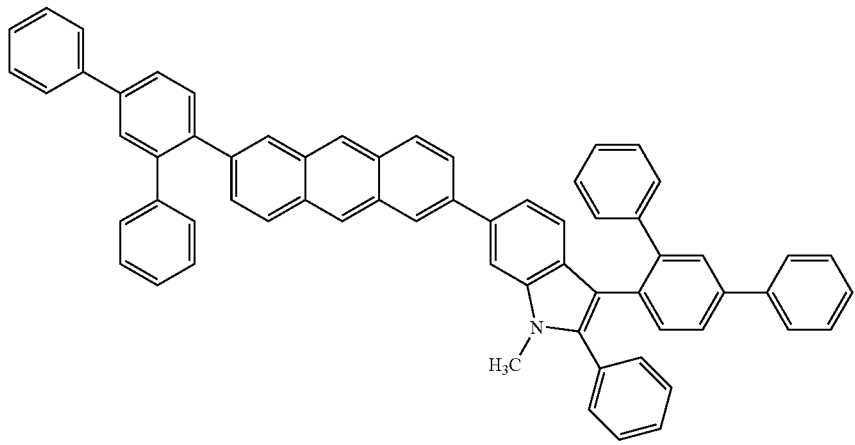

-continued
(19)
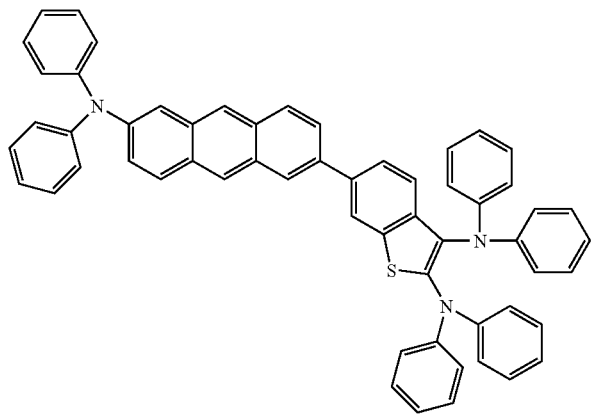
(20)
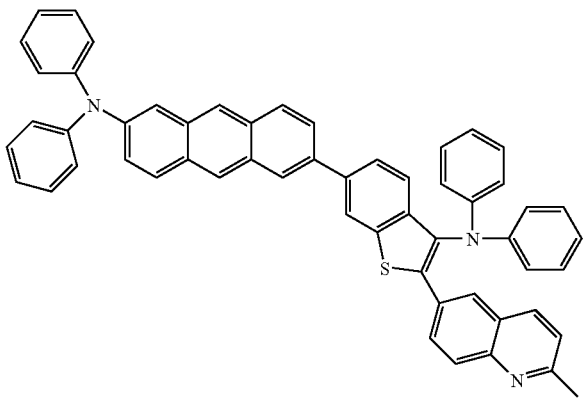
(21)
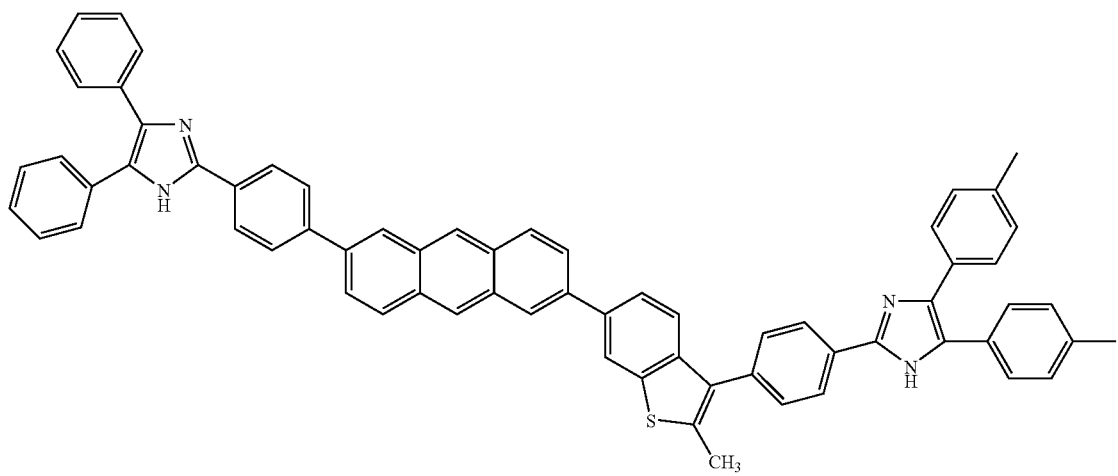
(22)
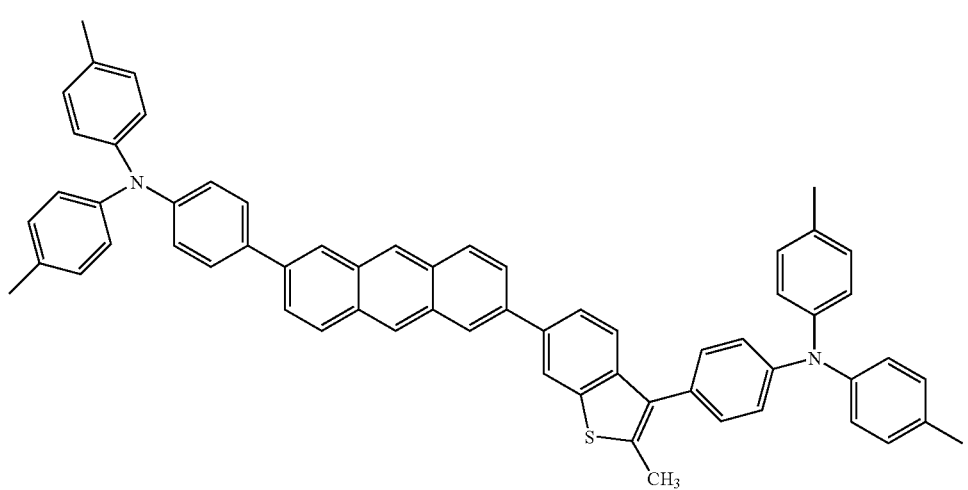

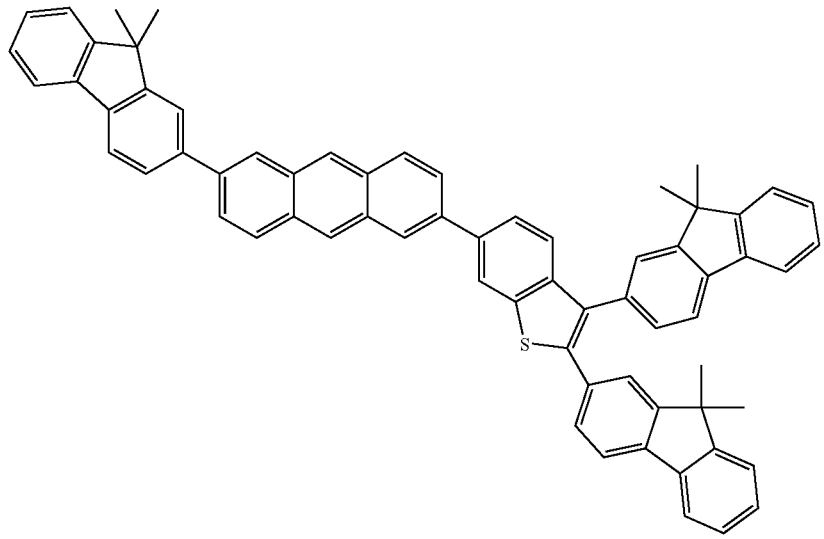
(23)
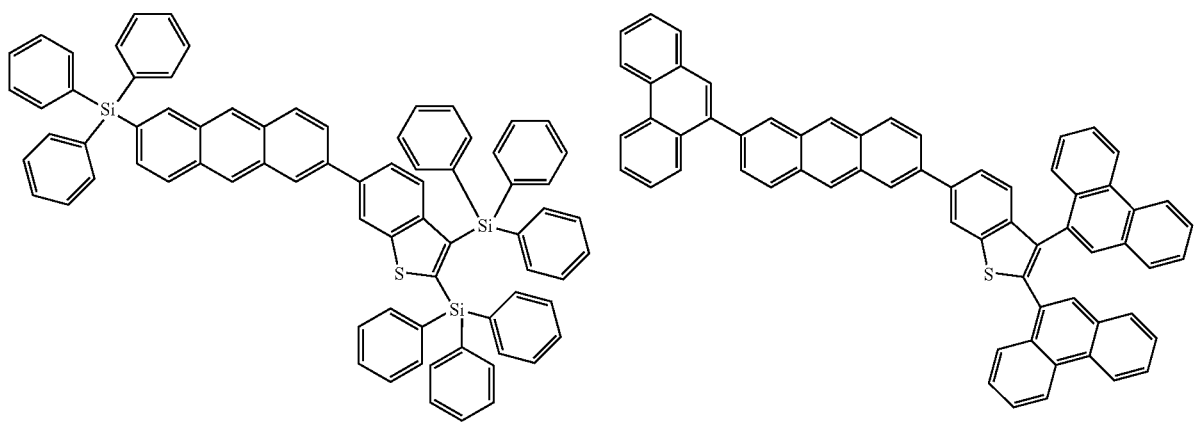
(24) (25)
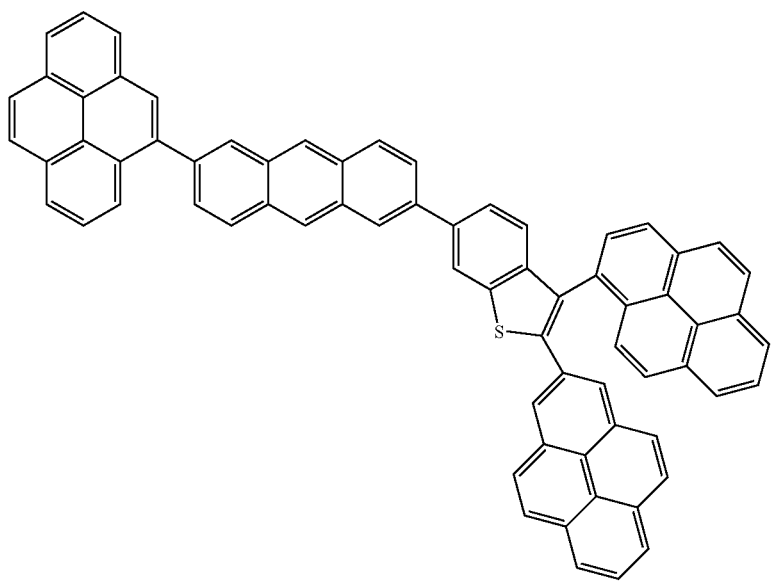
(26)

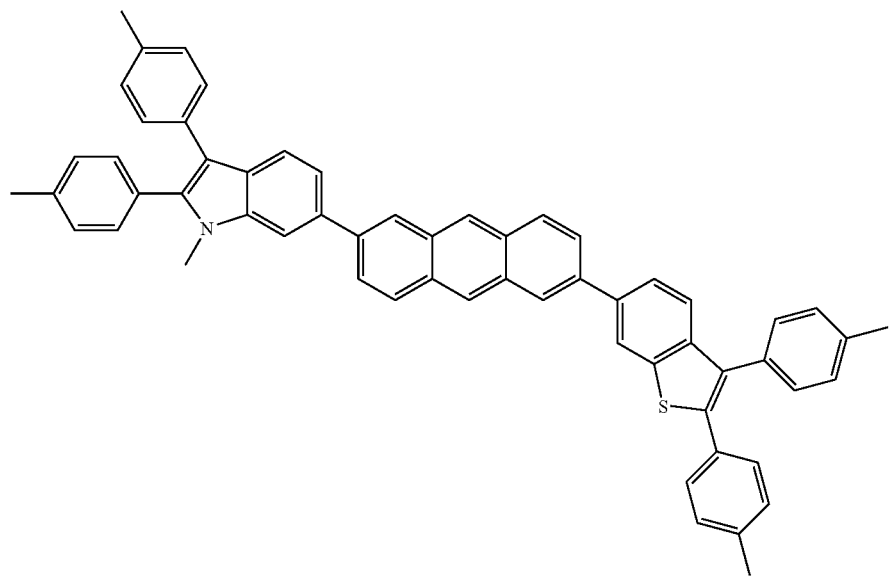

(27)

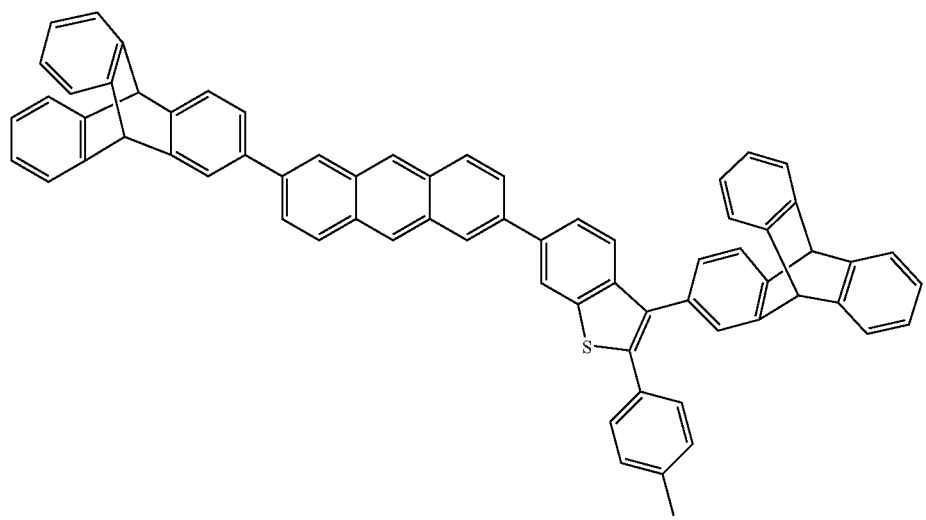

(28)

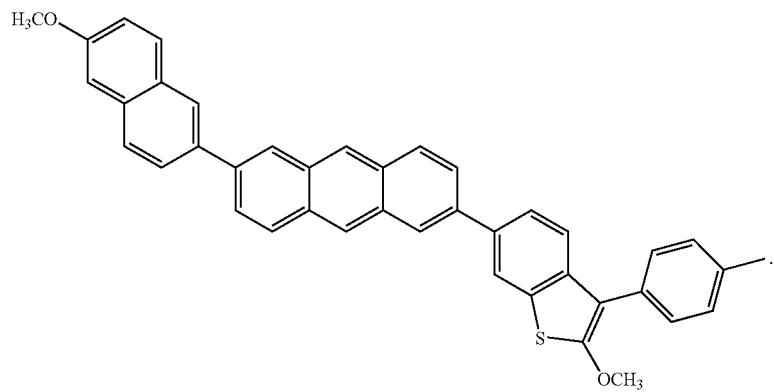

(29)

8. The organic EL device of claim 7, wherein the organic layer is a hole injection layer.

9. The organic EL device of claim 7, wherein the organic layer is a hole transport layer.

10. The organic EL device of claim 7, wherein the organic layer is an emissive layer.

11. The organic EL device of claim 7, further comprising at least one layer selected from the group consisting of a hole injection layer, a hole transport layer, an electron blocking layer, a hole blocking layer, an electron transport layer and an electron injection layer.

12. The organic EL device of claim 7, having a structure of the first electrode/a hole injection layer/an emissive layer/an electron transport layer/an electron injection layer/the second electrode, a structure of the first electrode/a hole injection layer/a hole transport layer/an emissive layer/an electron transport layer/an electron injection layer/the second electrode, or a structure of the first electrode/a hole injection layer/a hole transport layer/an emissive layer/a hole blocking layer/an electron transport layer/an electron injection layer/the second electrode.

13. The organic EL device of claim 7, wherein substituent groups of the substituted alkyl group, the substituted alkoxy group, the substituted aryl group, the substituted heteroaryl group, the substituted cycloalkyl group and the substituted heterocycloalkyl group are selected from the group consisting of —F; —Cl; —Br; —CN; —NO$_2$; —OH; a C$_1$-C$_{50}$ alkyl group which is unsubstituted or substituted with —F, —Cl, —Br, —CN, —NO$_2$ or —OH; a C$_1$-C$_{50}$ alkoxy group which is unsubstituted or substituted with —F, —Cl, —Br, —CN, —NO$_2$ or —OH; a C$_6$-C$_{50}$ aryl group which is unsubstituted or substituted with a C$_1$-C$_{50}$ alkyl group, a C$_1$-C$_{50}$ alkoxy group, —F, —Cl, —Br, —CN, —NO$_2$ or —OH; a C$_2$-C$_{50}$ heteroaryl group which is unsubstituted or substituted with a C$_1$-C$_{50}$ alkyl group, a C$_1$-C$_{50}$ alkoxy group, —F, —Cl, —Br, —CN, —NO$_2$ or —OH; a C$_5$-C$_{50}$ cycloalkyl group which is unsubstituted or substituted with a C$_1$-C$_{50}$ alkyl group, a C$_1$-C$_{50}$ alkoxy group, —F, —Cl, —Br, —CN, —NO$_2$ or —OH; a C$_5$-C$_{50}$ heterocycloalkyl group which is unsubstituted or substituted with a C$_1$-C$_{50}$ alkyl group, a C$_1$-C$_{50}$ alkoxy group, —F, —Cl, —Br, —CN, —NO$_2$ or —OH; and a group which is represented as —N (Z$_9$) (Z$_{10}$), where Z$_9$ and Z$_{10}$ are each independently selected from the group consisting of hydrogen; a C$_1$-C$_{50}$ alkyl group; or a C$_6$-C$_{50}$ aryl group which is substituted with a C$_1$-C$_{50}$ alkyl group.

14. The organic EL device of claim 7, wherein R$_1$, R$_2$, R$_3$, R$_4$, R$_5$, R$_6$, R$_7$, R$_8$, R$_9$, R$_{10}$, R$_{11}$, R$_{12}$, R$_{13}$ and R$_{14}$ are each independently selected from the group consisting of hydrogen, a C$_1$-C$_{50}$ alkyl group, a C$_1$-C$_{50}$ alkoxy group, a phenyl group, a biphenyl group, a pentalenyl group, a indenyl group, a naphthyl group, a biphenylenyl group, an anthracenyl group, an azulenyl group, a heptalenyl group, an acenaphthalenyl group, a phenalenyl group, a fluorenyl group, a methylanthryl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a fluorenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, an oxiranyl group, a pyrrolidinyl group, a pyrazolidinyl group, an imidazolidinyl group, a piperidinyl group, a piperazinyl group, a morpholinyl group, a di(C$_6$-C$_{50}$ aryl)amino group, a tri(C$_6$-C$_{50}$ aryl)silyl group and derivatives thereof.

15. The organic EL device of claim 14, wherein said derivatives thereof include at least one substituent selected from the group consisting of a methyl group, a methoxy group, a phenyl group, a tolyl group, a naphthyl group, a pyrenyl group, a phenanthrenyl group, a fluorenyl group, an imidazolinyl group, an indolyl group, a quinolinyl group, a diphenylamino group, a 2,3-di-p-tolylaminophenyl group, a triphenylsilyl group and derivatives thereof.

16. The organic EL device of claim 7, wherein X is C(Z$_6$)(Z$_7$), N(Z$_8$), O, S, SO$_2$, Se, or SeO$_2$, wherein Z$_6$, Z$_7$ and Z$_8$ are each independently hydrogen, a substituted or unsubstituted C$_1$-C$_{50}$ alkyl group or a C$_6$-C$_{50}$ aryl group.

17. The organic EL device of claim 7, wherein X is CH$_2$, C(CH$_3$)$_2$, C(C$_6$H$_5$)$_2$, NH, N—CH:, N—C$_6$H$_5$, O, SO$_2$ or S.

\* \* \* \* \*